(12) United States Patent
Okimoto et al.

(10) Patent No.: US 11,395,404 B2
(45) Date of Patent: Jul. 19, 2022

(54) WIRING BOARD AND METHOD FOR MANUFACTURING THE WIRING BOARD

(71) Applicant: DAI NIPPON PRINTING CO., LTD., Tokyo-to (JP)

(72) Inventors: Naoko Okimoto, Tokyo-to (JP); Kenichi Ogawa, Tokyo-to (JP); Mitsutaka Nagae, Tokyo-to (JP); Makiko Sakata, Tokyo-to (JP); Toru Miyoshi, Tokyo-to (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

(21) Appl. No.: 17/294,535

(22) PCT Filed: Oct. 31, 2019

(86) PCT No.: PCT/JP2019/042925
§ 371 (c)(1),
(2) Date: May 17, 2021

(87) PCT Pub. No.: WO2020/100625
PCT Pub. Date: May 22, 2020

(65) Prior Publication Data
US 2021/0410280 A1    Dec. 30, 2021

(30) Foreign Application Priority Data
Nov. 16, 2018    (JP) .............................. JP2018-215931

(51) Int. Cl.
*H05K 1/02*    (2006.01)
*H05K 3/00*    (2006.01)
*H05K 3/12*    (2006.01)
*H05K 1/03*    (2006.01)

(52) U.S. Cl.
CPC ......... *H05K 1/0283* (2013.01); *H05K 1/0393* (2013.01); *H05K 3/0044* (2013.01); *H05K 3/12* (2013.01); *H05K 2201/0133* (2013.01)

(58) Field of Classification Search
CPC ...... H05K 1/0283; H05K 1/0393; H05K 3/12; H05K 3/0011; H05K 3/0014; H05K 3/0044
See application file for complete search history.

(56) References Cited

FOREIGN PATENT DOCUMENTS

| JP | 2007-281406 A | 10/2007 |
| JP | 2013-187308 A | 9/2013 |

OTHER PUBLICATIONS

Dec. 3, 2019 International Search Report issued in International Patent Application No. PCT/JP2019/042925.

*Primary Examiner* — Jeremy C Norris
(74) *Attorney, Agent, or Firm* — Oliff PLC

(57) ABSTRACT

A wiring board includes a first substrate having stretchability, wiring disposed adjacent to a first surface of the first substrate and extending in a first direction, and a stopper disposed adjacent to the first surface or second surface of the first substrate. While stretch length of the wiring board is being increased in the first direction, electrical resistance of the wiring exhibits a first turning point at a first stretch length and tension applied to the wiring board exhibits a second turning point at a second stretch length smaller than the first stretch length. The first turning point is a point at which an increase in electrical resistance per unit stretch length changes. The second turning point is a point at which an increase in tension per unit stretch length changes.

24 Claims, 20 Drawing Sheets

WIRING BOARD AND METHOD FOR MANUFACTURING THE WIRING BOARD

BACKGROUND OF THE INVENTION

Technical Field

An embodiment of the present disclosure relates to a wiring board that includes a first substrate having stretchability and wiring, and also relates to a method for manufacturing the wiring board.

Background Art

Electronic devices with deformability, such as stretchability, have been studied in recent years. Examples of such devices include one that includes a stretchable substrate and stretchable silver wiring formed thereon, and one that includes a stretchable substrate and horseshoe-shaped wiring formed thereon (see, e.g., Patent Literature 1). Patent Literature 2 discloses a stretchable wiring board that includes a substrate and wiring on the substrate. The wiring board disclosed in Patent Literature 2 is manufactured by a method which involves forming a circuit on a substrate stretched in advance and relaxing the substrate after forming the circuit.

CITATION LIST

Patent Literature

PTL 1: Japanese Unexamined Patent Application Publication No. 2013-187308
PTL 2: Japanese Unexamined Patent Application Publication No. 2007-281406

SUMMARY OF THE INVENTION

Excessive stretching of the substrate causes problems in components, such as breaks in the wiring.

An object of embodiments of the present disclosure is to provide a wiring board and a wiring board manufacturing method that are capable of effectively solving such a problem.

An embodiment of the present disclosure is a wiring board that includes a first substrate having stretchability and having a first surface and a second surface opposite the first surface, wiring disposed adjacent to the first surface of the first substrate and extending in a first direction, and a stopper disposed adjacent to the first surface or second surface of the first substrate. While stretch length of the wiring board is being increased in the first direction, electrical resistance of the wiring exhibits a first turning point at a first stretch length and tension applied to the wiring board exhibits a second turning point at a second stretch length smaller than the first stretch length. The first stretch length is a stretch length of the wiring board in the first direction. The second stretch length is a stretch length of the wiring board in the first direction. The first turning point is a point at which an increase in electrical resistance per unit stretch length changes. The second turning point is a point at which an increase in tension per unit stretch length changes.

In the wiring board according to the embodiment of the present disclosure, the wiring may have a plurality of peaks appearing along the first direction.

In the wiring board according to the embodiment of the present disclosure, the stopper may have a higher flexural rigidity or elastic modulus than the first substrate.

In the wiring board according to the embodiment of the present disclosure, the first stretch length may be greater than or equal to 1.1 times the second stretch length.

In the wiring board according to the embodiment of the present disclosure, if the increase in tension per unit stretch length measured when the stretch length of the wiring board in the first direction is smaller than the second stretch length is referred to as a first tension increase rate and the increase in tension per unit stretch length measured when the stretch length of the wiring board in the first direction is greater than the second stretch length is referred to as a second tension increase rate, the second tension increase rate may be greater than the first tension increase rate and may be, for example, greater than or equal to twice the first tension increase rate.

In the wiring board according to the embodiment of the present disclosure, if the increase in electrical resistance per unit stretch length measured when the stretch length of the wiring board in the first direction is smaller than the first stretch length is referred to as a first electrical resistance increase rate and the increase in electrical resistance per unit stretch length measured when the stretch length of the wiring board in the first direction is greater than the first stretch length is referred to as a second electrical resistance increase rate, the second electrical resistance increase rate may be greater than the first electrical resistance increase rate and may be, for example, greater than or equal to twice the first electrical resistance increase rate.

In the wiring board according to the embodiment of the present disclosure, the stopper may include a stopper layer having a plurality of peaks appearing along the first direction.

In the wiring board according to the embodiment of the present disclosure, the stopper layer may be disposed adjacent to the first surface of the first substrate.

In the wiring board according to the embodiment of the present disclosure, the stopper layer may be disposed adjacent to the second surface of the first substrate.

The wiring board according to the embodiment of the present disclosure may further include a second substrate disposed adjacent to the second surface of the first substrate and configured to cover the stopper layer.

In the wiring board according to the embodiment of the present disclosure, the stopper may include a stopper member having a first end, a second end, and an intermediate portion between the first end and the second end. The first end and the second end may be coupled to a multilayer structure including the first substrate, and the intermediate portion is capable of being spaced apart from the multilayer structure.

Another embodiment of the present disclosure is a wiring board that includes a first substrate having stretchability and having a first surface and a second surface opposite the first surface, wiring disposed adjacent to the first surface of the first substrate and extending in a first direction, and a stopper disposed adjacent to the first surface or second surface of the first substrate. The wiring has a plurality of peaks appearing along the first direction. The stopper includes at least a stopper layer or a stopper member. The stopper layer has a plurality of peaks appearing along the first direction with a cycle greater than a cycle with which the plurality of peaks of the wiring appear along the first direction. The stopper member has a first end, a second end, and an intermediate portion between the first end and the second end; the first end and the second end are coupled to a multilayer structure including the first substrate, and the intermediate portion is capable of being spaced apart from the multilayer structure.

In the wiring board according to the embodiment of the present disclosure, the first substrate may contain a thermoplastic elastomer, a silicone rubber, a urethane gel, or a silicone gel.

In the wiring board according to the embodiment of the present disclosure, the stopper may include a fiber, a paper, a metal foil, or a resin film.

The wiring board according to the embodiment of the present disclosure may further include a support substrate.

In the wiring board according to the embodiment of the present disclosure, the support substrate may have a higher elastic modulus than the first substrate and may support the wiring.

In the wiring board according to the embodiment of the present disclosure, the support substrate may be disposed between the wiring and the first surface of the first substrate and may support the wiring.

In the wiring board according to the embodiment of the present disclosure, the support substrate may contain polyethylene naphthalate, polyimide, polycarbonate, acrylic resin, or polyethylene terephthalate.

The wiring board according to the embodiment of the present disclosure may further include an electronic component electrically connected to the wiring.

Another embodiment of the present disclosure is a wiring board manufacturing method for manufacturing a wiring board. The method includes a first stretching step of applying tension to a first substrate having stretchability to stretch the first substrate; a wiring step of forming wiring extending in a first direction, adjacent to a first surface of the first substrate stretched in the first stretching step; and a contraction step of removing the tension from the first substrate. The wiring board includes a stopper disposed adjacent to the first surface or second surface opposite the first surface of the first substrate. While stretch length of the wiring board is being increased in the first direction, electrical resistance of the wiring exhibits a first turning point at a first stretch length and tension applied to the wiring board exhibits a second turning point at a second stretch length smaller than the first stretch length. The first stretch length is a stretch length of the wiring board in the first direction. The second stretch length is a stretch length of the wiring board in the first direction. The first turning point is a point at which an increase in electrical resistance per unit stretch length changes. The second turning point is a point at which an increase in tension per unit stretch length changes.

The wiring board manufacturing method according to the embodiment of the present disclosure may further include a second stretching step of stretching the first substrate by a stretch ratio smaller than in the first stretching step after forming the wiring on the first substrate; and a step of providing the stopper adjacent to the first surface or second surface of the first substrate stretched in the second stretching step.

In the wiring board manufacturing method according to the embodiment of the present disclosure, the stopper may include a stopper member having a first end, a second end, and an intermediate portion between the first end and the second end. The first end and the second end are coupled to a multilayer structure including the first substrate, and the intermediate portion is capable of being spaced apart from the multilayer structure.

The embodiments of the present disclosure can reduce problems in components, such as breaks in the wiring.

DETAILED DESCRIPTION OF THE INVENTION

Figure 1:
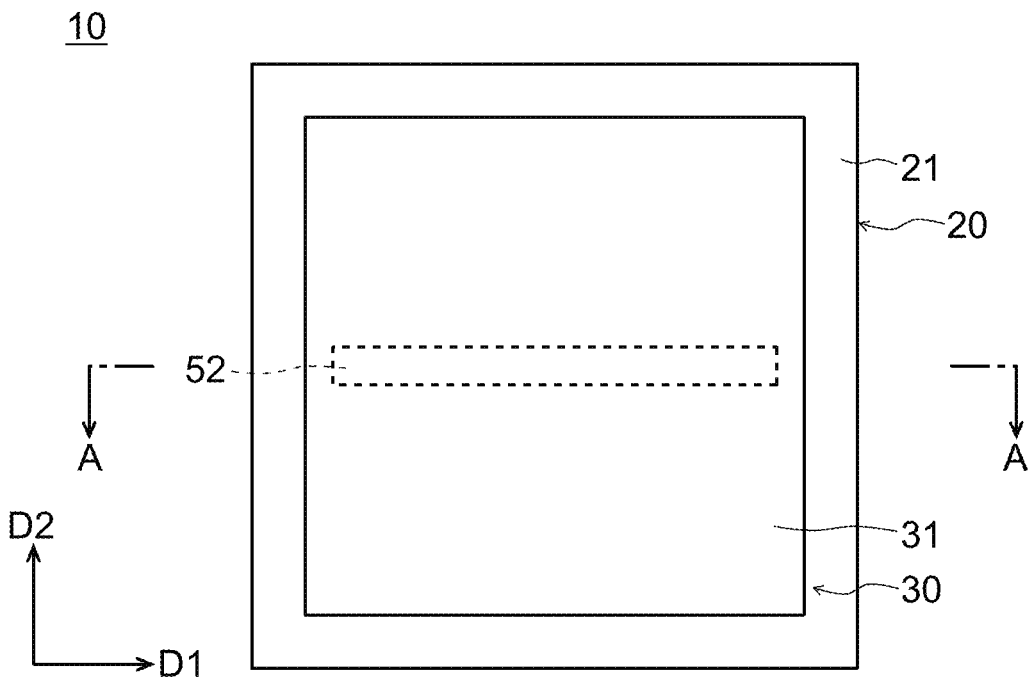
FIG. 1 is a plan view of a wiring board according to an embodiment.

A configuration of a wiring board and a method for manufacturing the wiring board according to embodiments of the present disclosure will now be described in detail with reference to the drawings. Note that the embodiments described herein are presented merely as exemplary embodiments of the present disclosure, and that the present disclosure is not to be interpreted as being limited to the embodiments described herein. Also, in the present specification, the terms such as "board", "substrate", "sheet", and "film" are not to be distinguished from one another solely on the basis of what they are called. For example, "board" is a concept that includes components that may be referred to as a substrate, a sheet, and a film. Also, for example, the terms such as "parallel" and "orthogonal" and the values of lengths and angles that specify shapes and geometric conditions and their degrees, as used in the present specification, are not to be bound by the exact meanings and are to be interpreted to include a scope within which similar functions can be achieved. In the drawings referenced in the present embodiment, parts that are the same, or have the same function, are assigned the same or similar reference signs, and overlapping description of such parts may be omitted. For convenience of explanation, the dimensional ratios in the drawings may differ from the actual ratios, or some components may not be shown in the drawings.

Hereinafter, an embodiment of the present disclosure will be described with reference to FIG. 1 to FIG. 9.

(Wiring Board)

Figure 2:
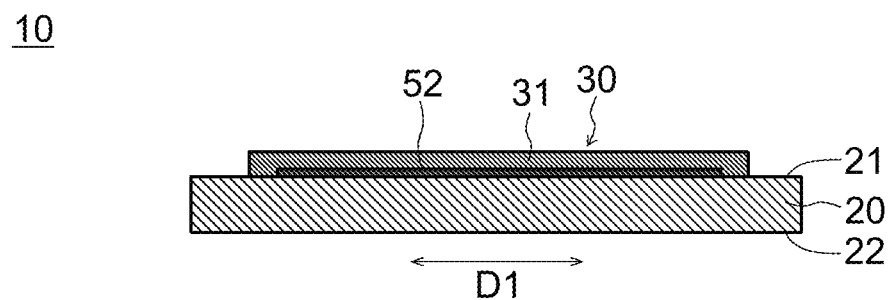
FIG. 2 is a cross-sectional view of the wiring board taken along line A-A in FIG. 1.

A wiring board 10 according to the present embodiment will now be described. FIG. 1 is a plan view of the wiring board 10. FIG. 2 is a cross-sectional view of the wiring board 10 taken along line A-A in FIG. 1.

The wiring board 10 illustrated in FIG. 1 includes at least a first substrate 20, wiring 52, and a stopper layer 31. Each component of the wiring board 10 will now be described.

<Substrate>

The first substrate 20 is a component configured to be stretchable in at least one direction. The first substrate 20 has a first surface 21 adjacent to the wiring 52 and a second surface 22 opposite the first surface 21. In the example illustrated in FIG. 1, as viewed in the direction normal to the first surface 21, the first substrate 20 has a rectangular shape with a pair of sides extending in a first direction D1 and a pair of sides extending in a second direction D2. The first direction D1 and the second direction D2 may be orthogonal, as illustrated in FIG. 1, or may not be orthogonal (not shown). In the following description, viewing the wiring board 10 or the components of the wiring board 10 in the direction normal to the first surface 21 may also be simply referred to as "plan view". In the present embodiment, the first substrate 20 is stretchable at least in the first direction D1. The first substrate 20 may also be stretchable in other directions, as well as in the first direction D1.

The thickness of the first substrate 20 is, for example, greater than or equal to 10 μm and less than or equal to 10 mm, and more preferably greater than or equal to 20 μm and less than or equal to 3 mm. When the thickness of the first substrate 20 is greater than or equal to 10 μm, durability of the first substrate 20 is ensured. When the thickness of the first substrate 20 is less than or equal to 10 mm, comfort in wearing the wiring board 10 is ensured. If the first substrate 20 is too small in thickness, the stretchability of the first substrate 20 may be impaired.

The stretchability of the first substrate 20 is a property that enables the first substrate 20 to extend and contract, that is, a property that enables the first substrate 20 to extend from a non-stretched (or normal) state and enables the first substrate 20 to be restored to normal when released from the stretched state. The non-stretched state is a state of the first substrate 20 in which the first substrate 20 is not under tensile stress. In the present embodiment, a stretchable substrate is capable of being stretched, without breaking, preferably greater than or equal to 1% of the non-stretched state, more preferably greater than or equal to 20% of the non-stretched state, and still more preferably greater than or equal to 75% of the non-stretched state. Using the first substrate 20 with such a capability can make the entire wiring board 10 stretchable. The wiring board 10 can thus be used in products and applications which require high stretchability. For example, the wiring board 10 can be attached to a part of a person's body, such as an arm. Generally, products attached to a person's armpit are said to require a stretchability of 72% in the vertical direction and a stretchability of 27% in the horizontal direction. Also, products attached to a person's knee, elbow, hips, ankle, or side are said to require a stretchability of greater than or equal to 26% and less than or equal to 42% in the vertical direction.

Also, products attached to other parts of the person's body are said to require a stretchability of less than 20%.

It is preferable that the difference between the shape of the first substrate 20 in the non-stretched state and the shape of the first substrate 20 restored to the non-stretched state after being stretched from the non-stretched state be small. This difference is also referred to as geometric or shape change in the following description. For example, the shape change of the first substrate 20, in area ratio, is less than or equal to 20%, more preferably less than or equal to 10%, and still more preferably less than or equal to 5%. Using the first substrate 20 with a small shape change facilitates formation of peaks and valleys (described below).

Examples of parameters representing the stretchability of the first substrate 20 include the elastic modulus of the first substrate 20. The elastic modulus of the first substrate 20 is, for example, less than or equal to 10 MPa, and more preferably less than or equal to 1 MPa. Using the first substrate 20 with such an elastic modulus can make the entire wiring board 10 stretchable. In the following description, the elastic modulus of the first substrate 20 is also referred to as a first elastic modulus. The first elastic modulus of the first substrate 20 may be greater than or equal to 1 kPa.

The first elastic modulus of the first substrate 20 may be calculated by performing a tensile test on a sample of the first substrate 20 in conformity with JIS K6251. Alternatively, the elastic modulus of the sample of the first substrate 20 may be measured by nanoindentation in conformity with ISO 14577. A nanoindenter may be used as a measuring instrument for the nanoindentation. The sample of the first substrate 20 may be prepared by extracting, as a sample, a part of the first substrate 20 from the wiring board 10, or by extracting, as a sample, a part of the first substrate 20 that has yet to be included in the wiring board 10. Examples of other methods for calculating the first elastic modulus of the first substrate 20 include a method which involves analyzing materials that form the first substrate 20, and calculating the first elastic modulus of the first substrate 20 on the basis of an existing material database. Note that the elastic modulus referred to in the present application is an elastic modulus obtained in a 25° C. environment.

Other examples of parameters representing the stretchability of the first substrate 20 may include flexural rigidity of the first substrate 20. Flexural rigidity is the product of the second moment of area of an object and the elastic modulus of a material forming the object, and is expressed in N·m² or Pa·m⁴. The second moment of area of the first substrate 20 is calculated on the basis of a cross-section of a portion of the first substrate 20 overlapping the wiring 52, taken along a plane orthogonal to the direction in which the wiring board 10 extends and contracts.

Examples of the material forming the first substrate 20 may include elastomers. Examples of the material that may be used to form the first substrate 20 include cloth, such as woven fabric, knitted fabric, and nonwoven fabric. Examples of the elastomers that may be used include thermoplastic elastomers and thermoset elastomers commonly used. Specifically, polyurethane-based elastomers, styrene-based elastomers, nitrile-based elastomers, olefin-based elastomers, polyvinyl chloride-based elastomers, ester-based elastomers, amide-based elastomers, 1,2-BR-based elastomers, fluorine-based elastomers, silicone rubbers, urethane rubbers, fluorine rubbers, polybutadiene, polyisobutylene, polystyrene-butadiene, and polychloroprene may be used. For greater mechanical strength and higher resistance to wear, it is preferable to use urethane-based elastomers. The first substrate 20 may contain silicone, such as polydimethylsiloxane. Silicone, which has high heat resistance, chemical resistance, and incombustibility, is desirable as a material for the first substrate 20.

<Wiring>

The wiring 52 is a conductive component that is long and narrow in plan view. In the example illustrated in FIG. 1, the wiring 52 extends in the first direction D1.

In the present embodiment, the wiring 52 is disposed adjacent to the first surface 21 of the first substrate 20. As illustrated in FIG. 2, the wiring 52 may be in contact with the first surface 21 of the first substrate 20. While not shown, another component may be interposed between the first surface 21 of the first substrate 20 and the wiring 52.

A material of the wiring 52 is one that is capable of following extension and contraction of the first substrate 20 using elimination and generation of peaks (described below). The material of the wiring 52 may be either stretchable or non-stretchable.

Examples of the non-stretchable material that can be used for the wiring 52 include metals such as gold, silver, copper, aluminum, platinum, and chromium and alloys containing these metals. When the material of the wiring 52 is non-stretchable, a metal film may be used as the wiring 52.

When the material used for the wiring 52 is stretchable, the material is as stretchable as, for example, the first substrate 20. Examples of the stretchable material that can be used for the wiring 52 include conductive compositions that contain conductive particles and elastomers. Any conductive particles that are capable of being used for wiring can be used. Examples of the conductive particles include particles of gold, silver, copper, nickel, palladium, platinum, and carbon. It is particularly preferable to use silver particles.

The wiring 52 preferably has a structure that is resistant to deformation. For example, the wiring 52 includes a base material and a plurality of conductive particles dispersed in the base material. In this case, when a deformable material, such as resin, is used as the base material, the wiring 52 can deform as the first substrate 20 extends and contracts. Even when deformation occurs, the conductivity of the wiring 52 can be maintained by setting the distribution and shape of the conductive particles in such a manner as to maintain contact between the conductive particles.

Examples of the material forming the base material of the wiring 52 include thermoplastic elastomers and thermoset elastomers commonly used. Specifically, styrene-based elastomers, acrylic-based elastomers, olefin-based elastomers, urethane-based elastomers, silicone rubbers, urethane rubbers, fluorine rubbers, nitrile rubbers, polybutadiene, and polychloroprene may be used. It is particularly preferable to use resins or rubbers having a urethane-based or silicone-based structure, because of their stretchability and durability. Examples of materials forming the conductive particles in the wiring 52 include particles of silver, copper, gold, nickel, palladium, platinum, and carbon. It is particularly preferable to use silver particles.

The wiring 52 may have any thickness that enables the wiring 52 to withstand the extension and contraction of the first substrate 20. The thickness of the wiring 52 is appropriately selected in accordance with, for example, the material of the first substrate 20.

For example, when the material of the wiring 52 is non-stretchable, the thickness of the wiring 52 may be greater than or equal to 25 nm and less than or equal to 100 μm, preferably greater than or equal to 50 nm and less than or equal to 50 µm, and more preferably greater than or equal to 100 nm and less than or equal to 5 µm.

When the material of the wiring 52 is stretchable, the thickness of the wiring 52 may be greater than or equal to 5 µm and less than or equal to 60 µm, preferably greater than or equal to 10 µm and less than or equal to 50 µm, and more preferably greater than or equal to 20 µm and less than or equal to 40 µm.

The width of the wiring 52 is, for example, greater than or equal to 50 µm and less than or equal to 10 mm.

The width of the wiring 52 is appropriately selected in accordance with the electrical resistance value required for the wiring 52. The width of the wiring 52 is, for example, greater than or equal to 1 µm, and preferably greater than or equal to 50 µm. Also, the width of the wiring 52 is, for example, less than or equal to 10 mm, and preferably less than or equal to 1 mm.

A method for forming the wiring 52 is appropriately selected in accordance with, for example, the material. Examples of the method include one in which after a metal film is formed on the first substrate 20 or a support substrate 40 (described below) by vapor deposition, sputtering, or other techniques, the metal film is patterned by photolithography. When the material of the wiring 52 is stretchable, for example, a conductive composition containing the conductive particles and elastomers may be formed into a pattern by printing on the first substrate 20 or the support substrate 40 using a printing technique commonly used. It may be particularly preferable to use a printing technique that provides high material efficiency and allows inexpensive manufacture.

<Stopper Layer>

The stopper layer 31 is a layer for reducing problems in components, such as breaks in the wiring 52, caused by excessive stretching of the first substrate 20. The stopper layer 31 uses its rigidity to suppress excessive stretching of the first substrate 20. In the present application, a component, such as the stopper layer 31, for suppressing the first substrate 20 from being stretched more than a certain degree is also referred to as a stopper 30.

The stopper layer 31 may be disposed adjacent to the first surface 21 of the first substrate 20. In the present embodiment, as illustrated in FIG. 1 and FIG. 2, the stopper layer 31 is disposed adjacent to the first surface 21 of the first substrate 20 in such a manner as to overlap the wiring 52. In this case, the stopper layer 31 can also serve as a protective layer that protects the wiring 52 from the outside. The term "overlap" means that two components overlap as viewed in the direction normal to the first surface 21 of the first substrate 20. The stopper layer 31 may be in contact with the wiring 52, or another layer, such as an insulating layer, may be interposed between the wiring 52 and the stopper layer 31.

The stopper 30, such as the stopper layer 31, may have an elastic modulus greater than the first elastic modulus of the first substrate 20 in the first direction D1. The elastic modulus of the stopper 30 is, for example, greater than or equal to 10 GPa and less than or equal to 500 GPa, and more preferably greater than or equal to 1 GPa and less than or equal to 300 GPa. If the elastic modulus of the stopper 30 is too low, it may be difficult to reduce stretching of the first substrate 20. If the elastic modulus of the stopper 30 is too high, the extension and contraction of the first substrate 20 may cause structural damage, such as splits and cracks, in the stopper 30. The elastic modulus of the stopper 30 may be greater than or equal to 1.1 times and less than or equal to 5000 times the first elastic modulus of the first substrate 20, and more preferably greater than or equal to 10 times and less than or equal to 3000 times the first elastic modulus of the first substrate 20. In the following description, the elastic modulus of the stopper 30 is also referred to as a second elastic modulus.

A method for calculating the second elastic modulus of the stopper 30 is appropriately determined in accordance with the configuration of the stopper 30. For example, the method for calculating the second elastic modulus of the stopper 30 may either be the same as or different from the method for calculating the elastic modulus of the first substrate 20 described above. This also applies to the elastic modulus of the support substrate 40 (described below). For example, the elastic modulus of the stopper 30 or support substrate 40 may be calculated by performing a tensile test on a sample of the stopper 30 or support substrate 40 in conformity with ASTM D882.

When the second elastic modulus of the stopper 30 is greater than the first elastic modulus of the first substrate 20, a thin-film metal material may be used as a material forming the stopper 30. Examples of the metal material include copper, aluminum, and stainless steel. Examples of the material that may be used to form the stopper 30 include thermoplastic elastomers commonly used, and acrylic-based, urethane-based, epoxy-based, polyester-based, epoxy-based, vinyl ether-based, polyene thiol-based, or silicone-based oligomers and polymers. When the material forming the stopper 30 is any of these resins, the stopper 30 may be transparent.

The stopper 30 may be a component that includes fibers, such as vegetable fibers, animal fibers, or synthetic fibers. Examples of such a component include paper, yarn, and cloth. Examples of the cloth include woven fabric, knitted fabric, and nonwoven fabric.

The stopper 30 may serve as a shield against light, such as ultraviolet light. For example, the stopper 30 may be black in color. The stopper 30 and the first substrate 20 may have the same color.

The thickness of the stopper 30 is, for example, greater than or equal to 1 µm and less than or equal to 5 mm, and more preferably greater than or equal to 10 µm and less than or equal to 500 µm.

A characteristic of the stopper 30 may be represented by flexural rigidity, instead of the elastic modulus. The second moment of area of the stopper 30 is calculated on the basis of a cross-section of the stopper 30 taken along a plane orthogonal to the direction in which the wiring 52 extends. The flexural rigidity of the stopper 30 may be greater than or equal to 1.1 times the flexural rigidity of the first substrate 20, more preferably greater than or equal to 2 times the flexural rigidity of the first substrate 20, and still more preferably greater than or equal to 10 times the flexural rigidity of the first substrate 20.

A method for forming the stopper layer 31, which serves as the stopper 30, is appropriately selected in accordance with, for example, the material. Examples of the method include one in which after the wiring 52 is formed on the first substrate 20 or the support substrate 40 (described below), a material forming the stopper layer 31 is applied by printing onto the wiring 52 or the first substrate 20. A component forming the stopper layer 31, such as cloth, paper, metal foil, or resin film, may be bonded to the wiring 52 or the first substrate 20, with an adhesive layer interposed therebetween.

Figure 3:
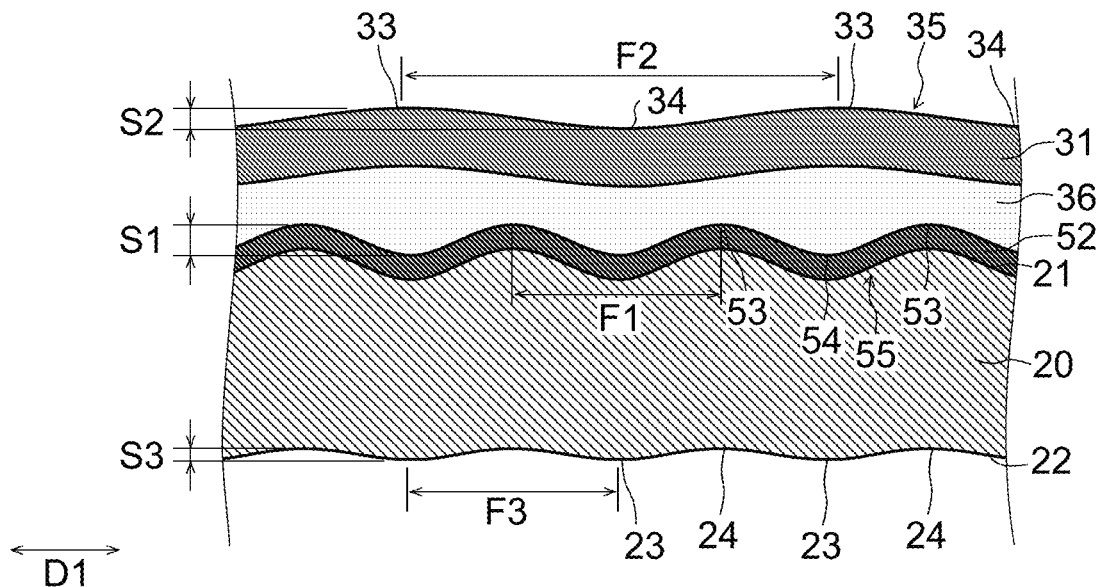
FIG. 3 is an enlarged cross-sectional view of the wiring board illustrated in FIG. 2.

A cross-sectional shape of the wiring board 10 will now be described in detail with reference to FIG. 3. FIG. 3 is an enlarged cross-sectional view of the wiring board 10.

The wiring 52 is formed on the first substrate 20 that is stretched by a first stretch length under tension. In this case, when the tension is removed from the first substrate 20 to allow the first substrate 20 to contract, the wiring 52 deforms into undulations, as illustrated in FIG. 3, to create an undulating portion 55.

The undulating portion 55 of the wiring 52 has a plurality of peaks 53 appearing along the first direction D1 in which the wiring 52 extends. The peaks 53 are raised portions of the surface of the wiring 52 in the direction normal to the first surface 21. As illustrated in FIG. 3, there may also be valleys 54 each between two adjacent ones of the peaks 53 in the direction in which the wiring 52 extends.

Referring to FIG. 3, which illustrates the plurality of peaks 53 appearing along the direction in which the wiring 52 extends, reference sign S1 denotes the amplitude of the plurality of peaks 53 in the direction normal to the first surface 21 of the first substrate 20. The amplitude S1 is, for example, greater than or equal to 1 μm, and more preferably greater than or equal to 10 μm. When the amplitude S1 is greater than or equal to 10 μm, the wiring 52 can easily deform as the first substrate 20 is stretched. The amplitude S1 may be, for example, less than or equal to 500 μm.

The amplitude S1 is calculated, for example, by averaging the distances measured, in the direction normal to the first surface 21, between adjacent ones of the peaks 53 and valleys 54 over a given range in the direction in which the wiring 52 extends. The "given range in the direction of length of the wiring 52" is, for example, 10 mm. A measuring instrument used to measure the distances may be, for example, a non-contact measuring instrument with a laser microscope, or a contact measuring instrument. The distances may be measured on the basis of images, such as cross-sectional photographs. The same applies to the calculation of amplitude S2 and amplitude S3 described below.

In FIG. 3, reference sign F1 denotes a cycle between adjacent ones of the plurality of peaks 53 appearing along the direction in which the wiring 52 extends. The cycle F1 of the peaks 53 is calculated by averaging the distances measured between adjacent ones of the plurality of peaks 53 over a given range in the direction in which the wiring 52 extends. The cycle F1 is, for example, greater than or equal to 10 μm, and more preferably greater than or equal to 100 μm. Also, the cycle F1 is, for example, less than or equal to 100 mm, and more preferably less than or equal to 10 mm. While not shown, the plurality of peaks 53 may irregularly appear along the first direction D1. For example, the distances between two adjacent ones of the peaks 53 in the first direction D1 may vary.

The advantage of having the undulating portion 55 in the wiring 52 will now be described. Since the first substrate 20 is stretchable as described above, the first substrate 20 can be stretched by elastic deformation. If the wiring 52 is similarly stretched by elastic deformation, the resulting increase in the overall length of the wiring 52 and the resulting decrease in the cross-sectional area of the wiring 52 lead to an increased resistance value of the wiring 52. The elastic deformation of the wiring 52 may cause damage to the wiring 52, such as cracks.

In the present embodiment, the wiring 52 has the undulating portion 55. Therefore, when the first substrate 20 is stretched, the wiring 52 deforms to reduce the ups and downs of the undulating portion 55, or to eliminate the undulations, so as to be able to follow the stretching of the first substrate 20. This can suppress the increase in the overall length of the wiring 52 and the decrease in the cross-sectional area of wiring 52 that are associated with the stretching of the first substrate 20. It is thus possible to suppress an increase in the resistance value of the wiring 52 caused by stretching of the wiring board 10. Damage to the wiring 52, such as cracks, can also be suppressed.

In the wiring board 10 of the present embodiment, however, if the first substrate 20 is further stretched after being stretched until the undulations in the wiring 52 are eliminated, the wiring 52 itself may be stretched and this may cause damage to the wiring 52, such as cracks. In the present embodiment, where the first substrate 20 is provided with the stopper 30 such as the stopper layer 31, the first substrate 20 can be suppressed from being excessively stretched. This makes it possible to suppress damage to the wiring 52, such as cracks. The structure of the stopper layer 31 will now be described in detail.

After the wiring 52 is formed on the first substrate 20, the stopper layer 31 is added to the first substrate 20 while the first substrate 20 is being stretched under tension by a second stretch length smaller than the first stretch length. The stopper layer 31 is added to the first substrate 20 with an adhesive layer 36 interposed therebetween. When the tension is removed from the first substrate 20 to allow the first substrate 20 to contract, the stopper layer 31 deforms into undulations, as illustrated in FIG. 3, to create an undulating portion 35, as in the case of the wiring 52.

The undulating portion 35 of the stopper layer 31 has, as in the case of the wiring 52, a plurality of peaks 33 appearing along the first direction D1 in which the wiring 52 extends. As illustrated in FIG. 3, there may be valleys 34 each between two adjacent ones of the peaks 33.

Referring to FIG. 3, which illustrates the plurality of peaks 33 appearing along the direction in which the wiring 52 extends, reference sign S2 denotes the amplitude of the plurality of peaks 33 in the direction normal to the first surface 21 of the first substrate 20. The amplitude S2 of the peaks 33 of the stopper layer 31 may be smaller than the amplitude S1 of the peaks 53 of the wiring 52. The amplitude S2 may be less than or equal to 0.9 times the amplitude S1, less than or equal to 0.8 times the amplitude S1, or less than or equal to 0.6 times the amplitude S1. The amplitude S2 may be less than or equal to 500 μm, or less than or equal to 300 μm. When the amplitude S2 of the peaks 33 of the stopper layer 31 is smaller than the amplitude S1 of the peaks 53 of the wiring 52, the undulating portion 35 of the stopper layer 31 is eliminated by stretching the first substrate 20, earlier than the undulating portion 55 of the wiring 52. This means that the stretching of the first substrate 20 can be restrained until the undulating portion 55 of the wiring 52 is eliminated. The amplitude S2 of the peaks 33 of the stopper layer 31 may be greater than or equal to 10 μm. While not shown, the amplitude S2 of the peaks 33 of the stopper layer 31 may be greater than the amplitude S1 of the peaks 53 of the wiring 52. The amplitude S2 can be greater than the amplitude S1 when the stopper layer 31 has a higher hardness than the first substrate 20.

In FIG. 3, reference sign F2 denotes a cycle between adjacent ones of the plurality of peaks 33 appearing along the direction in which the wiring 52 extends. The cycle F2 of the peaks 33 of the stopper layer 31 may be greater than the cycle F1 of the peaks 53 of the wiring 52. The cycle F2 may be, for example, greater than or equal to 1.1 times the cycle F1, greater than or equal to 1.2 times the cycle F1, greater than or equal to 1.5 times the cycle F1, or greater than or equal to 2.0 times the cycle F1. The cycle F2 is, for example, greater than or equal to 100 μm, and more preferably greater than or equal to 500 μm. When the cycle F2 of the peaks 33 of the stopper layer 31 is greater than the cycle F1 of the peaks 53 of the wiring 52, the undulating portion 35 of the stopper layer 31 is eliminated by stretching the first substrate 20, earlier than the undulating portion 55 of the wiring 52. This means that the stretching of the first substrate 20 can be restrained until the undulating portion 55 of the wiring 52 is eliminated. The cycle F2 of the peaks 33 of the stopper layer 31 may be less than or equal to 5 times the cycle F1.

As illustrated in FIG. 3, when the stopper layer 31 is formed with the adhesive layer 36 interposed between the first substrate 20 and the stopper layer 31, a material that can be used to form the adhesive layer 36 may be, for example, an acrylic-based adhesive or a silicone-based adhesive. The thickness of the adhesive layer 36 is, for example, greater than or equal to 5 μm and less than or equal to 200 μm.

As illustrated in FIG. 3, a surface of the wiring board 10 located at the second surface 22 side of the first substrate 20 may also have a plurality of peaks 23 and valleys 24 appearing along the direction in which the wiring 52 extends. In the example illustrated in FIG. 3, the peaks 23 located at the second surface 22 side emerge to coincide with the respective valleys 54 of the wiring 52 adjacent to the first surface 21, and the valleys 24 at the second surface 22 side emerge to coincide with the respective peaks 53 of the wiring 52 adjacent to the first surface 21.

Referring to FIG. 3, which illustrates, in the surface of the wiring board 10 located at the second surface 22 side of the first substrate 20, the plurality of peaks 23 appearing along the direction in which the wiring 52 extends, reference sign S3 denotes the amplitude of the plurality of peaks 23 in the direction normal to the second surface 22 of the first substrate 20. The amplitude S3 of the peaks 23 located at the second surface 22 side may either be the same as, or different from, the amplitude S1 of the peaks 53 of the wiring 52. For example, the amplitude S3 of the peaks 23 located at the second surface 22 side may be smaller than the amplitude S1 of the peaks 53 of the wiring 52. For example, the amplitude S3 of the peaks 23 located at the second surface 22 side may be less than or equal to 0.9 times the amplitude S1 of the peaks 53 of the wiring 52, less than or equal to 0.8 times the amplitude S1, or less than or equal to 0.6 times the amplitude S1. The amplitude S3 of the peaks 23 located at the second surface 22 side may be greater than or equal to 0.1 times the amplitude S1 of the peaks 53 of the wiring 52, or greater than or equal to 0.2 times the amplitude S1. Note that "the amplitude S3 of the peaks 23 located at the second surface 22 side is smaller than the amplitude S1 of the peaks 53 of the wiring 52" is a concept that includes the case where no peaks appear in the surface of the wiring board 10 located at the second surface 22 side.

In FIG. 3, reference sign F3 denotes a cycle between adjacent ones of the plurality of peaks 23 appearing in the surface of the wiring board 10 located at the second surface 22 side of the first substrate 20, along the direction in which the wiring 52 extends. The cycle F3 of the peaks 23 located at the second surface 22 side may be the same as the cycle F1 of the peaks 53 of the wiring 52, as illustrated in FIG. 3.

Figure 4:
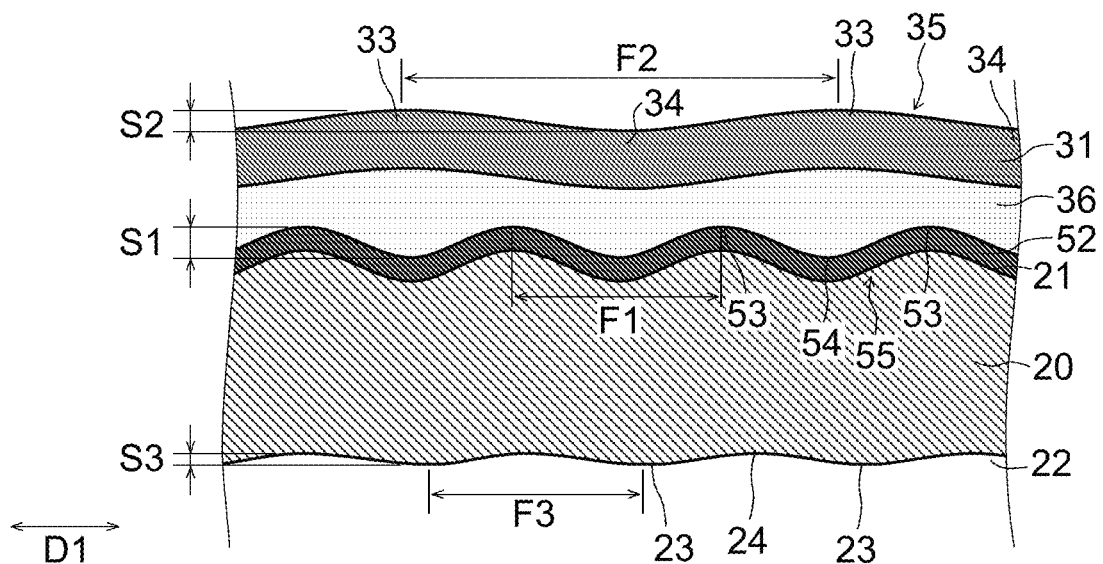
FIG. 4 is another exemplary cross-sectional view of the wiring board.

FIG. 4 is another exemplary cross-sectional view of the wiring board 10. As illustrated in FIG. 4, the cycle F3 of the peaks 23 located at the second surface 22 side may be greater than the cycle F1 of the peaks 53 of the wiring 52. For example, the cycle F3 of the peaks 23 located at the second surface 22 side may be greater than or equal to 1.1 times the cycle F1 of the peaks 53 of the wiring 52, greater than or equal to 1.2 times the cycle F1, greater than or equal to 1.5 times the cycle F1, or greater than or equal to 2.0 times the cycle F1. Note that "the cycle F3 of the peaks 23 located at the second surface 22 side is greater than the cycle F1 of the peaks 53 of the wiring 52" is a concept that includes the case where no peaks appear in the surface of the wiring board 10 located at the second surface 22 side.

Figure 5:
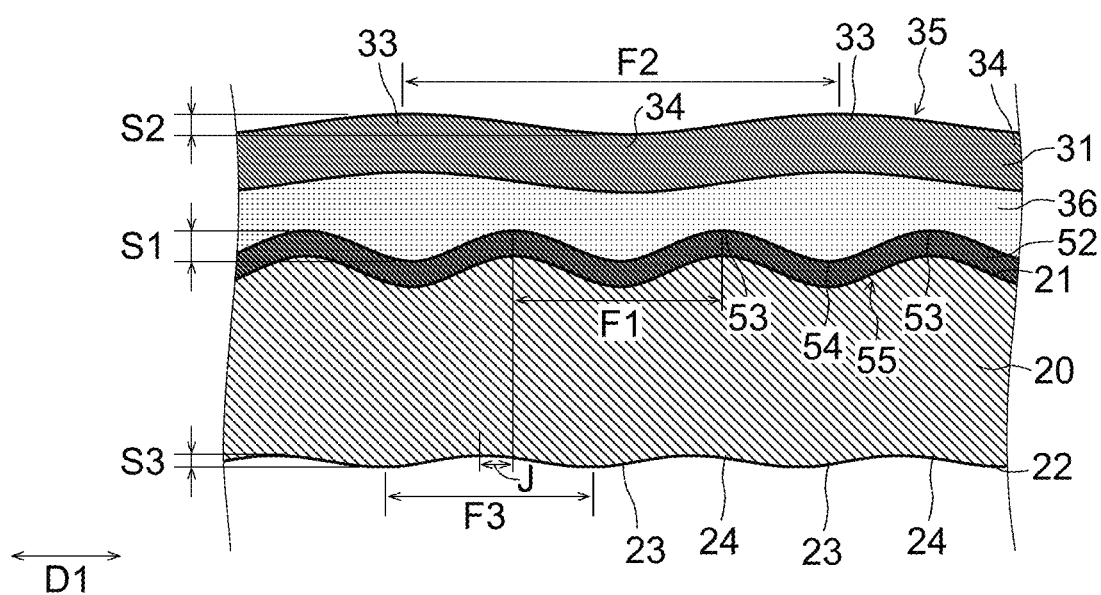
FIG. 5 is another exemplary cross-sectional view of the wiring board.

FIG. 5 is another exemplary cross-sectional view of the wiring board 10. As illustrated in FIG. 5, the peaks 23 and valleys 24 located at the second surface 22 side may be displaced by "J" from the valleys 54 and peaks 53 of the wiring 52 adjacent to the first surface 21. The amount of displacement J is, for example, greater than or equal to 0.1×F1, and may be greater than or equal to 0.2×F1.

(Method for Manufacturing Wiring Board)

A method for manufacturing the wiring board 10 will now be described with reference to FIGS. 6A to 6C and FIGS. 7A to 7C.

Figure 6A:
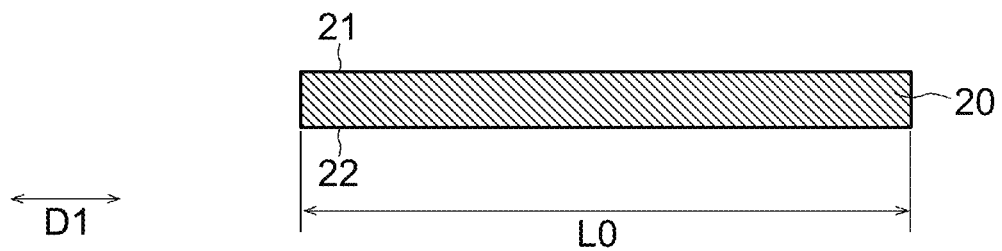
FIG. 6A is a series of diagrams for explaining a method for manufacturing the wiring board.

As illustrated in FIG. 6A, a substrate preparing step is performed which involves preparing the first substrate 20 that is a stretchable substrate having the first surface 21 and the second surface 22. Reference sign L0 represents a dimension of the first substrate 20 under no tension, in the first direction D1.

Figure 6B:
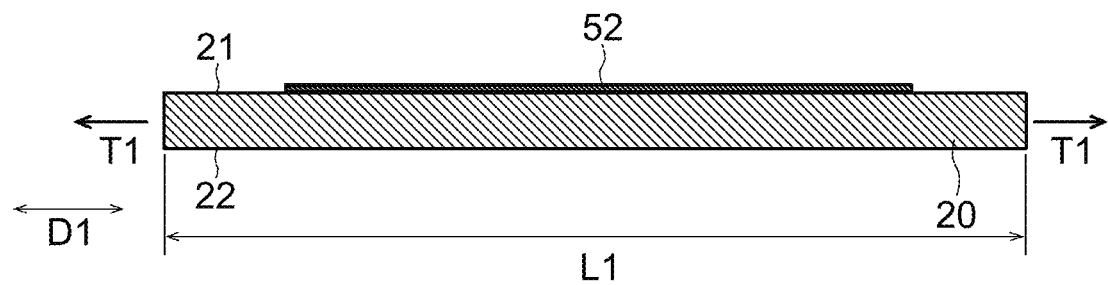
FIG. 6B is a series of diagrams for explaining a method for manufacturing the wiring board.
Figure 6C:
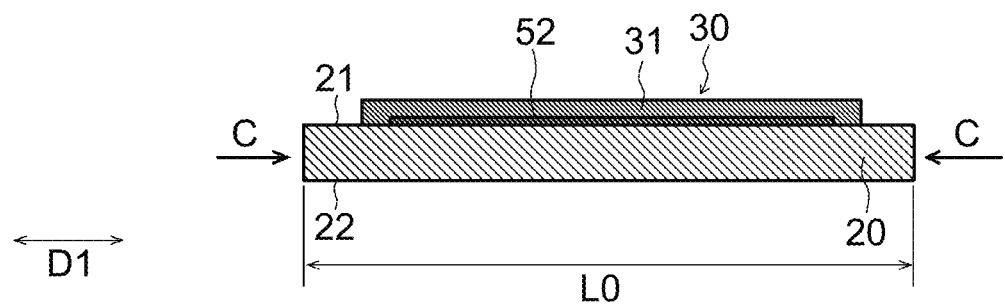
FIG. 6C is a series of diagrams for explaining a method for manufacturing the wiring board.

Next, as illustrated in FIG. 6B, a first stretching step is performed which involves applying a first tension T1 to the first substrate 20 in the first direction D1 to stretch the first substrate 20 to a dimension L1. The stretch ratio of the first substrate 20 in the first direction D1 ($=(L1-L0)\times 100/L0$) is, for example, greater than or equal to 10% and less than or equal to 200%. The stretching step may be performed on the first substrate 20 under heat or at room temperature. The temperature of the first substrate 20 under heat is, for example, higher than or equal to 50° C. and lower than or equal to 100° C.

Next, as illustrated in FIG. 6B, a wiring step is performed which involves forming the wiring 52 on the first surface 21 of the first substrate 20 stretched under the first tension T1 applied thereto in the first stretching step. For example, a conductive paste containing a base material and conductive particles is applied by printing onto the first surface 21 of the first substrate 20.

Then, a first contraction step is performed which involves removing the first tension T1 from the first substrate 20. Thus, as indicated by arrow C in FIG. 6C, the first substrate 20 contracts in the first direction D1 to cause the wiring 52 on the first substrate 20 to deform accordingly. As described above, the deformation of the wiring 52 may emerge in the form of the undulating portion 55.

Figure 7A:
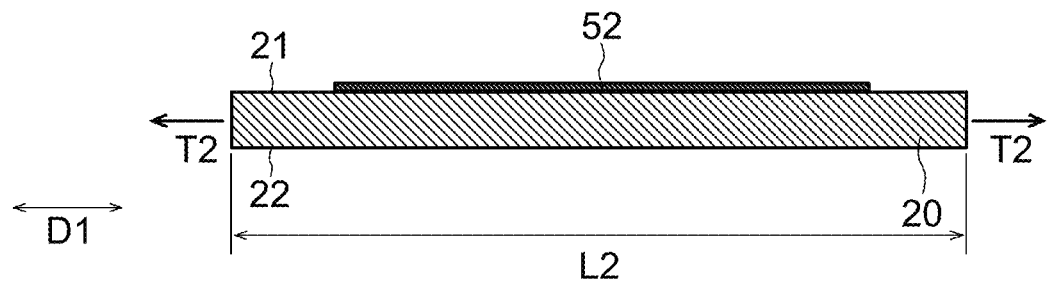
FIG. 7A is another series of diagrams for explaining the method for manufacturing the wiring board.

Next, as illustrated in FIG. 7A, a second stretching step is performed which involves applying a second tension T2 to the first substrate 20 in the first direction D1 to stretch the first substrate 20 to a dimension L2. The second tension T2 is smaller than the first tension T1 applied in the first stretching step. The stretch ratio of the first substrate 20 in the second stretching step ($=(L2-L0)\times 100/L0$) is thus smaller than the stretch ratio of the first substrate 20 in the first stretching step. Therefore, in the second stretching step, the undulating portion 55 of the wiring 52 is not completely eliminated. The stretch ratio of the first substrate 20 in the second stretching step may be less than or equal to 0.9 times that of the first substrate 20 in the first stretching step, less than or equal to 0.8 times that of the first substrate 20 in the first stretching step, or less than or equal to 0.6 times that of the first substrate 20 in the first stretching step.

Figure 7B:
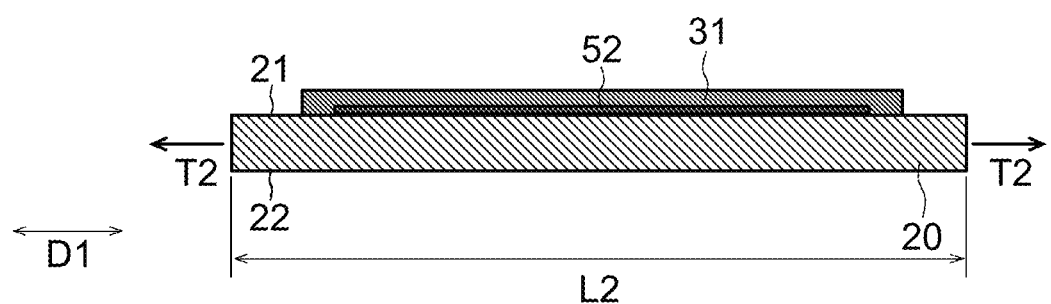
FIG. 7B is another series of diagrams for explaining the method for manufacturing the wiring board.
Figure 7C:
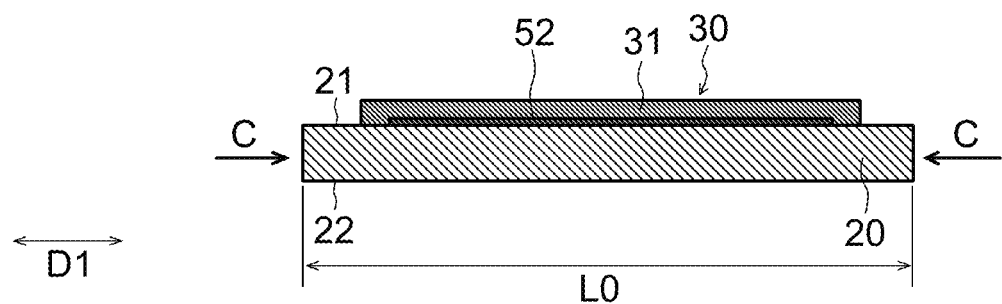
FIG. 7C is another series of diagrams for explaining the method for manufacturing the wiring board.

Next, as illustrated in FIG. 7B, a step is performed which involves providing the stopper layer 31 adjacent to the first surface 21 of the first substrate 20 stretched under the second tension T2 applied thereto in the second stretching step. For example, the stopper layer 31 formed of cloth, paper, metal foil, or resin film is bonded adjacent to the first surface 21 of the first substrate 20, with the adhesive layer 36 interposed therebetween, in such a manner as to cover the wiring 52.

Then, a second contraction step is performed which involves removing the second tension T2 from the first substrate 20. Thus, as indicated by arrow C in FIG. 7C, the first substrate 20 contracts in the first direction D1 to cause the stopper layer 31 on the first substrate 20 to deform accordingly. As described above, the deformation of the stopper layer 31 may emerge in the form of the undulating portion 35. The wiring board 10 is thus produced which includes the first substrate 20, the wiring 52, and the stopper 30.

Figure 8:
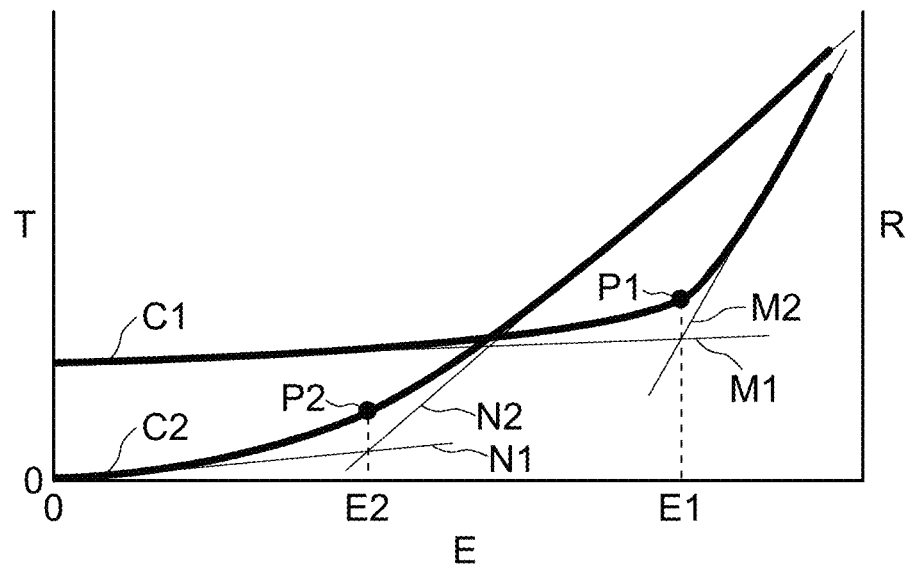
FIG. 8 is a diagram illustrating an example of how the tension and the electrical resistance of wiring change when the wiring board is stretched.

The operation of the wiring board 10 will now be described with reference to FIG. 8. FIG. 8 is a diagram illustrating an example of how the tension and the electrical resistance of the wiring 52 change when the wiring board 10 is stretched. In FIG. 8, the horizontal axis represents a stretch length E of the wiring board 10, the vertical axis on the left side represents a tension T applied to the wiring board 10, and the vertical axis on the right side represents an electrical resistance R between two points of the wiring 52 along the first direction D1.

In FIG. 8, a line with reference sign C1 is drawn by connecting a series of measurement points obtained by measuring the electrical resistance R between two points on the wiring 52 while the wiring board 10 is being stretched in the first direction D1. A line with reference sign C2 is drawn by connecting a series of measurement points obtained by measuring the tension T applied to the wiring board 10 while the wiring board 10 is being stretched in the first direction D1. A measuring instrument that can be used to measure the tension T is one that is capable of measuring the stretch ratio and the elastic modulus in conformity with "JIS L 1096: Testing methods for woven and knitted fabrics". Examples of the measuring instrument include a universal material testing instrument, TENSILON, from A&D Company, Limited. Also, a measuring instrument that can be used to measure the electrical resistance R is, for example, a KEITHLEY 2000 digital multimeter from Keithley Instruments. The distance between the two points on the wiring 52 in the first direction D1 is greater than or equal to 10 mm and less than or equal to 200 mm. For example, the distance is 30 mm.

As illustrated in FIG. 8, the electrical resistance R has a first turning point P1 when the stretch length E of the first substrate 20 in the first direction D1 is the first stretch length E1. The first turning point P1 is a point at which an increase in electrical resistance R per unit stretch length changes. The first turning point P1 appears when, for example, the undulating portion 55 of the wiring 52 is eliminated.

In the example illustrated in FIG. 8, the first turning point P1 is defined as a point that has a stretch length at the point where a straight line M1 and a straight line M2 cross. The straight line M1 is a straight line tangent to the line C1 at a position where the stretch length E is zero. The slope of the straight line M1 represents an increase in electrical resistance R per unit stretch length measured when the stretch length E of the wiring board 10 in the first direction D1 is smaller than the first stretch length E1 (hereinafter also referred to as a first electrical resistance increase rate). The straight line M2 is a straight line that approximates the line C1 at a position where the slope of the line C1 is significantly greater than the slope of the straight line M1. The slope of the straight line M2 represents an increase in electrical resistance R per unit stretch length measured when the stretch length E of the wiring board 10 in the first direction D1 is greater than the first stretch length E1 (hereinafter also referred to as a second electrical resistance increase rate).

The second electrical resistance increase rate may preferably be greater than or equal to twice the first electrical resistance increase rate, greater than or equal to three times the first electrical resistance increase rate, or greater than or equal to four times the first electrical resistance increase rate. While not shown, the first turning point P1 may be defined as a point where the slope of the line C1 is twice that of the straight line M1.

As illustrated in FIG. 8, the tension T has a second turning point P2 when the stretch length E of the first substrate 20 in the first direction D1 is the second stretch length E2. The second turning point P2 is a point at which an increase in tension T per unit stretch length changes. The second turning point P2 appears when, for example, the undulating portion 35 of the stopper layer 31 is eliminated.

In the example illustrated in FIG. 8, the second turning point P2 is defined as a point that has a stretch length at the point where a straight line N1 and a straight line N2 cross. The straight line N1 is a straight line tangent to the line C2 at a position where the stretch length E is zero. The slope of the straight line N1 represents an increase in tension T per unit stretch length measured when the stretch length E of the wiring board 10 in the first direction D1 is smaller than the second stretch length E2 (hereinafter also referred to as a first tension increase rate). The straight line N2 is a straight line that approximates the line C2 at a position where the slope of the line C2 is significantly greater than the slope of the straight line N1. The slope of the straight line N2 represents an increase in tension T per unit stretch length measured when the stretch length E of the wiring board 10 in the first direction D1 is greater than the second stretch length E2 (hereinafter also referred to as a second tension increase rate).

The second tension increase rate may preferably be greater than or equal to twice the first tension increase rate, greater than or equal to three times the first tension increase rate, or greater than or equal to four times the first tension increase rate. While not shown, the second turning point P2 may be defined as a point where the slope of the line C2 is twice that of the straight line N1.

In the present embodiment, as described above, the stretch ratio of the first substrate 20 at the time of adding the stopper layer 31 is smaller than the stretch ratio of the first substrate 20 at the time of forming the wiring 52. Accordingly, when the wiring board 10 including the first substrate 20 is stretched, the undulating portion 35 of the stopper layer 31 is eliminated before the undulating portion 55 of the wiring 52 is eliminated. Thus, as illustrated in FIG. 8, the second turning point P2 appears in the wiring board 10 when the stretch length E is the second stretch length E2 smaller than the first stretch length E1.

Figure 9:
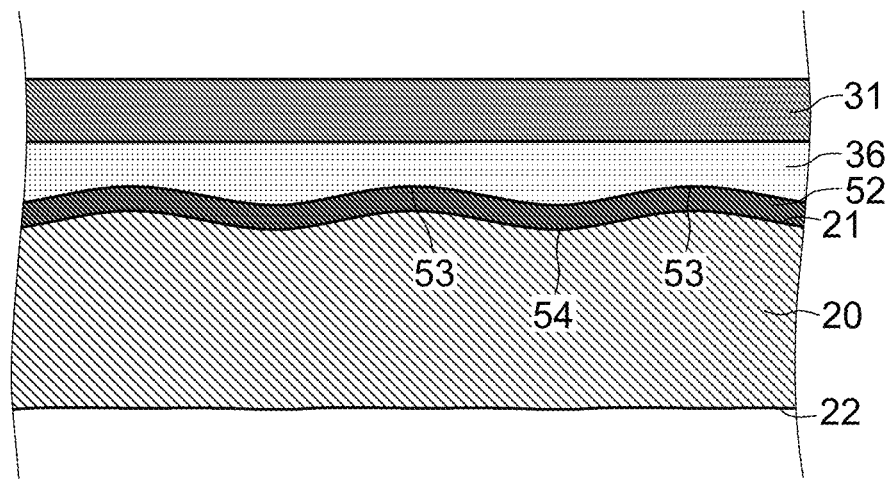
FIG. 9 is a cross-sectional view of the wiring board stretched by a second stretch length.

FIG. 9 is an exemplary cross-sectional view of the wiring board 10 stretched by the second stretch length E2. In the example illustrated in FIG. 9, the undulating portion 35 of the stopper layer 31 is eliminated, but the undulating portion 55 of the wiring 52 is not eliminated. To further stretch the wiring board 10 illustrated in FIG. 9, it is necessary to deform the stopper layer 31 in the first direction D1. Accordingly, after the second turning point P2 appears, the slope of the line C2 increases significantly, as illustrated in FIG. 8, and the wiring board 10 is not stretched easily. The wiring board 10 can thus be suppressed from being excessively stretched. This can reduce problems in components of the wiring board 10, such as breaks in the wiring 52.

The first stretch length E1 may preferably be greater than or equal to 1.1 times the second stretch length E2, greater than or equal to 1.2 times the second stretch length E2, greater than or equal to 1.5 times the second stretch length E2, or greater than or equal to 2.0 times the second stretch length E2. When the first stretch length E1 is greater than or equal to 1.1 times the second stretch length E2, it is easier to stop stretching of the wiring board 10 before the length by which to stretch the wiring board 10 reaches the first stretch length E1. The first stretch length E1 may be less than or equal to 5 times the second stretch length E2. In other words, the second stretch length E2 may be greater than or equal to ⅕ of the first stretch length E1. This makes it possible to secure a stretch length required when, for example, the wiring board 10 is attached to a part of a person's body, such as an arm.

As described above, the present embodiment enables the wiring board 10 to be stretched in the first direction D1 during use while reducing problems, such as breaks, in the wiring 52. The wiring board 10 can thus be used in applications that require stretchability in various directions.

An exemplary effect associated with the electrical resistance value of the wiring 52, achieved by the peaks 53 of the wiring 52, will now be described. The electrical resistance value of the wiring 52 in a first state where no tension is applied to the first substrate 20 in the first direction D1, is referred to as a first electrical resistance value. Also, the resistance value of the wiring 52 in a second state where tension is applied to the first substrate 20 in the first direction D1 to stretch the first substrate 20 by 30% of its length in the first state, is referred to as a second electrical resistance value. In the present embodiment, where the wiring 52 has the peaks 53, the ratio of the absolute value of the difference between the first electrical resistance value and the second electrical resistance value to the first electrical resistance value can be less than or equal to 20%, more preferably less than or equal to 10%, and still more preferably less than or equal to 5%. Note that the stretch length of the wiring board 10 in the second state is smaller than the first stretch length E1 described above.

The wiring board 10 is applicable to the fields of, for example, healthcare, medicine, nursing, electronics, sports and fitness, beauty, mobility, livestock and pets, amusement, fashion and apparel, security, military, distribution, education, building materials, furniture, decorating, environment and energy, agriculture, forestry, fisheries, and robotics. For example, products attached to a part of a person's body, such as an arm, may be made using the wiring board 10 according to the present embodiment. Since the wiring board 10 is stretchable, the wiring board 10 can be tightly attached to part of the body when, for example, the wiring board 10 is attached to the body while being stretched. A good fit is thus achieved. Since a decrease in the electrical resistance value of the wiring 52 caused by stretching the wiring board 10 can be reduced, good electrical characteristics of the wiring board 10 can be achieved. Because of its stretchability, the wiring board 10 can be installed or embedded to conform to the curved surface or three-dimensional shape of various products, as well as living bodies, such as human bodies. Examples of such products include vital sensors, masks, hearing aids, toothbrushes, adhesive tapes, compresses, contact lenses, prosthetic arms, prosthetic legs, eye prostheses, catheters, gauze, chemical packs, bandages, disposable bioelectrodes, diapers, rehabilitation equipment, consumer electronics, displays, signage, personal computers, mobile-phone handsets, mouses, speakers, sportswear, wristbands, headbands, gloves, swimwear, athletic supporters, balls, baseball gloves, rackets, clubs, bats, fishing rods, relay batons and gymnastics equipment, grips of the batons and gymnastics equipment, physical training equipment, swim tubes, tents, swimwear, number bibs, goal nets, goal tapes, essence-saturated masks, electrical stimulation diet products, heating pads, artificial nails, tattoos, automobiles, airplanes, trains, boats and ships, bicycles, strollers, drones, wheelchairs, vehicle seats, instrument panels, tires, interior materials, exterior materials, saddles, handles, roads, rails, bridges, tunnels, gas and water pipes, electric wires, tetrapods, rope collars, leads, harnesses, tags for animals, bracelets, belts, game devices, haptic devices such as controllers, place mats, tickets, dolls, stuffed animals, cheering goods, hats, clothes, glasses, shoes, insoles, socks, stockings, slippers, underwear, scarfs, earmuffs, bags, accessories, rings, watches, ties, personal ID devices, helmets, packages, IC tags, plastic bottles, stationery, books, pens, carpets, sofas, bedding, lighting equipment, door knobs, handrails, vases, beds, mattresses, cushions, curtains, doors, windows, ceilings, walls, floors, wireless power antennas, batteries, plastic greenhouses, nets (meshes), robotic hands, and robotic armor.

In the present embodiment, the stopper layer 31 having a higher elastic modulus or flexural rigidity than the first substrate 20 is disposed adjacent to the first surface 21 of the first substrate 20. This makes it easier to control the undulating portion 55 appearing in the wiring 52 as the first substrate 20 contracts. For example, the peaks 53 of the undulating portion 55 can be suppressed from being locally raised. The wiring 52 can thus be prevented from being damaged by large stress applied thereto.

When the stopper layer 31 is formed of an insulating material, such as a resin film or cloth, the stopper layer 31 may also serve as an insulating layer that insulates the wiring 52 from the outside.

Various changes may be made to the embodiment described above. Modifications will now be described with reference to the drawings where appropriate. In the following description and drawings to be used in the following description, parts that can be configured similarly to those in the aforementioned embodiment are assigned the same reference signs as those used for the corresponding parts in the embodiment, and overlapping description of such parts will be omitted. If it is obvious that the operations and effects achieved in the aforementioned embodiment will also be achieved in the modifications, the description of such operations and effects may be omitted.

(First Modification)

Figure 10:
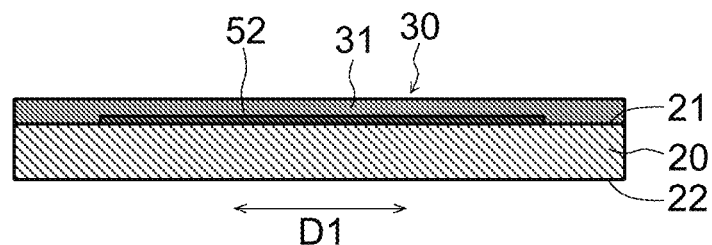
FIG. 10 is a cross-sectional view of a wiring board according to a first modification.

In the embodiment described above, the first substrate 20 includes a region that does not overlap the stopper 30. However, the configuration is not limited to this. As illustrated in FIG. 10, the stopper 30 may be disposed to overlap the entire region of the first substrate 20.

(Second Modification)

Figure 11:
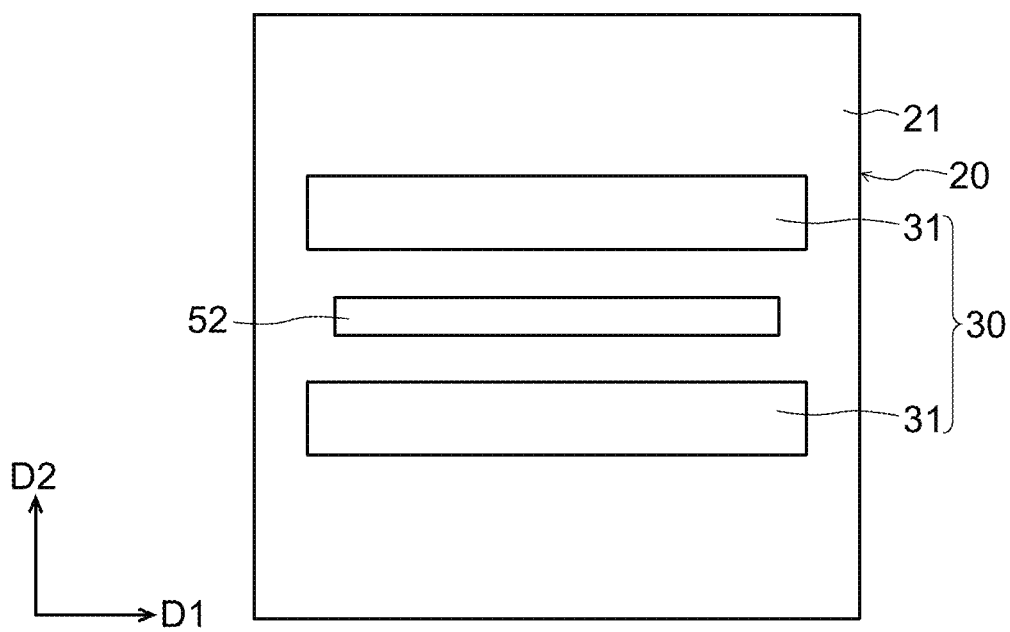
FIG. 11 is a plan view of a wiring board according to a second modification.

The stopper 30 overlaps the wiring 52 in the embodiment described above. However, the configuration is not limited to this. As illustrated in FIG. 11, the stopper 30 does not necessarily need to overlap the wiring 52 in plan view. Referring to FIG. 11, the stopper 30 is disposed in the area where the wiring 52 extends in the first direction D1. With this configuration, the first substrate 20 that overlaps the wiring 52 can be suppressed from being excessively stretched.

(Third Modification)

Figure 12A:
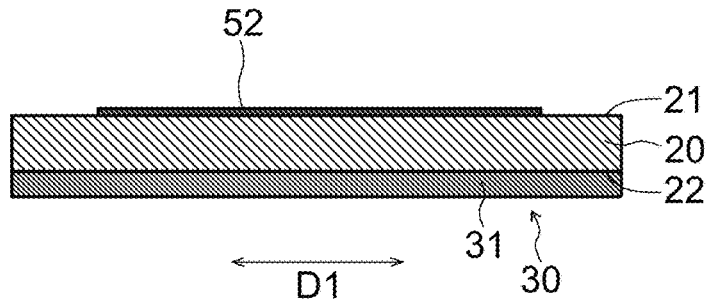
FIG. 12A is a cross-sectional view of a wiring board according to a third modification.

In the embodiment described above, the stopper layer 31 of the stopper 30 is disposed adjacent to the first surface 21 of the first substrate 20. However, the configuration is not limited to this. As illustrated in FIG. 12A, the stopper layer 31 may be disposed adjacent to the second surface 22 of the first substrate 20. In this case, the stopper layer 31 may be in contact with the second surface 22 of the first substrate 20, or another component may be interposed between the second surface 22 of the first substrate 20 and the stopper layer 31.

Figure 12B:
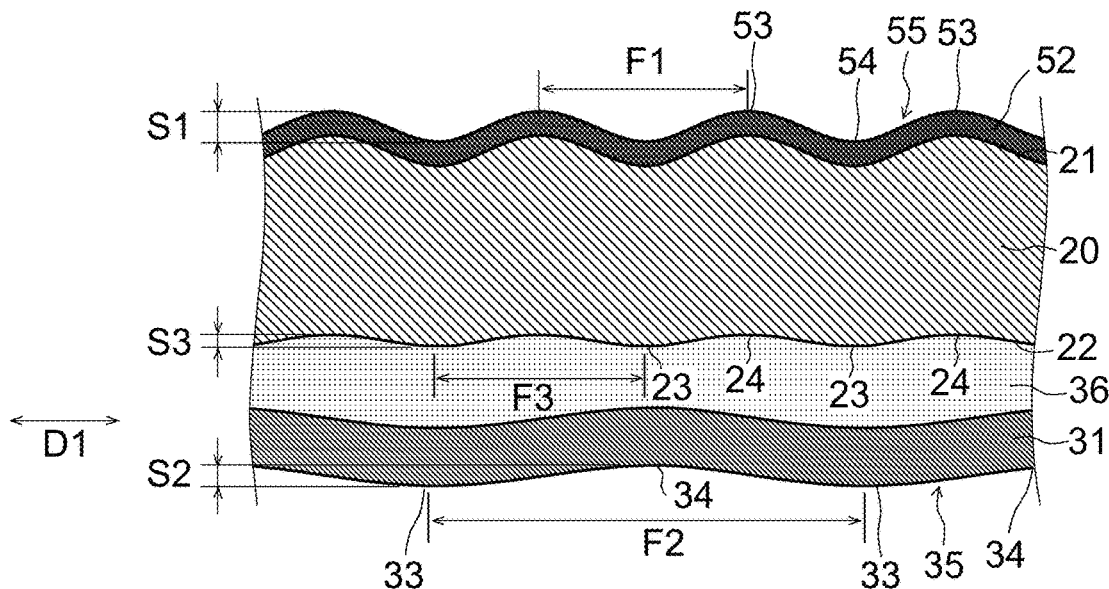
FIG. 12B is an enlarged cross-sectional view of the wiring board illustrated in FIG. 12A.

FIG. 12B is an enlarged cross-sectional view of the wiring board 10 illustrated in FIG. 12A. In the present modification, after the wiring 52 is formed adjacent to the first surface 21 of the first substrate 20, the stopper layer 31 is provided adjacent to the second surface 22 of the first substrate 20 which is stretched, under tension, by the second stretch length smaller than the first stretch length. Therefore, when the tension is removed from the substrate 20 to allow the first substrate 20 to contract, the stopper layer 31 may deform into undulations to allow the undulating portion 35 to emerge. As in the case of the embodiment described above, the undulating portion 35 has the plurality of peaks 33 appearing along the first direction D1 in which the wiring 52 extends. As illustrated in FIG. 12B, there may be valleys 34 each between two adjacent ones of the peaks 33. The amplitude S2 and the cycle F2 of the peaks 33 of the stopper layer 31 are the same as those in the aforementioned embodiment and thus will not be described in detail.

(Fourth Modification)

Figure 13:
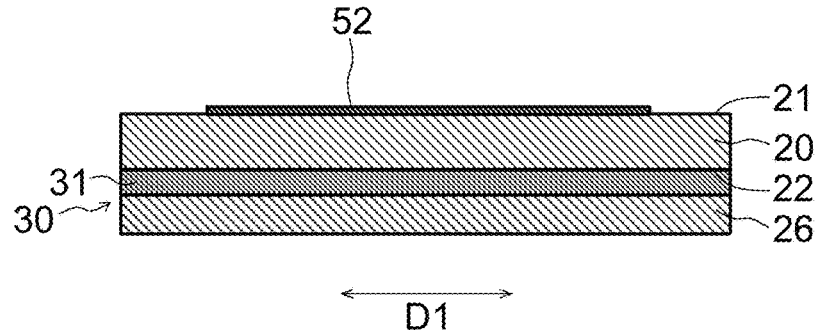
FIG. 13 is a cross-sectional view of a wiring board according to a fourth modification.

In the third modification described above, the stopper layer 31 of the stopper 30 constitutes a surface of the wiring board 10 opposite the surface thereof having the wiring 52 thereon. However, the configuration is not limited to this. As illustrated in FIG. 13, the wiring board 10 may further includes a second substrate 26 disposed on the stopper layer 31. As a material forming the second substrate 26, one that has been described as a material for the first substrate 20 may be used. The material forming the first substrate 20 and the material forming the second substrate 26 may either be the same or different. An adhesive layer may be interposed between the stopper layer 31 and the second substrate 26.

(Fifth Modification)

Although the wiring 52 is disposed on the first surface 21 of the first substrate 20 in the embodiment described above, the configuration is not limited to this. In the present modification, the wiring 52 is supported by a support substrate.

Figure 14:
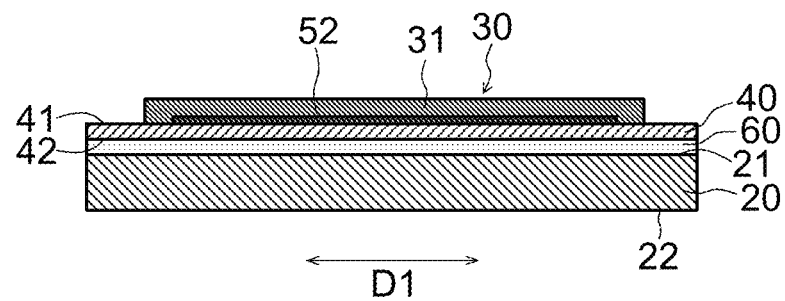
FIG. 14 is a cross-sectional view of a wiring board according to a fifth modification.

FIG. 14 is a cross-sectional view of the wiring board 10 according to a fifth modification. The wiring board 10 includes at least the first substrate 20, the support substrate 40, the wiring 52, and the stopper layer 31.

<Support Substrate>

The support substrate 40 is a component configured to be less stretchable than the first substrate 20. The support substrate 40 has a second surface 42 adjacent to the first substrate 20 and a first surface 41 opposite the second surface 42. In the example illustrated in FIG. 14, the support substrate 40 supports the wiring 52 adjacent to the first surface 41. At the same time, the support substrate 40 is joined to the first surface 21 of the first substrate 20 adjacent to the second surface 42. For example, an adhesive layer 60 containing an adhesive may be interposed between the first substrate 20 and the support substrate 40. Examples of a material that can be used to form the adhesive layer 60 include an acrylic-based adhesive and a silicone-based adhesive. The thickness of the adhesive layer 60 is, for example, greater than or equal to 5 μm and less than or equal to 200 μm.

In the present modification, the stopper layer 31 is disposed adjacent to the first surface 41 of the support substrate 40 in such a manner as to cover the wiring 52. The stopper layer 31 may be in contact with the wiring 52, or another layer, such as an insulating layer, may be interposed between the wiring 52 and the stopper layer 31. The stopper layer 31 adjacent to the first surface 41 of the support substrate 40 may be disposed in such a manner that it does not overlap the wiring 52, as in the case of the second modification.

Figure 15:
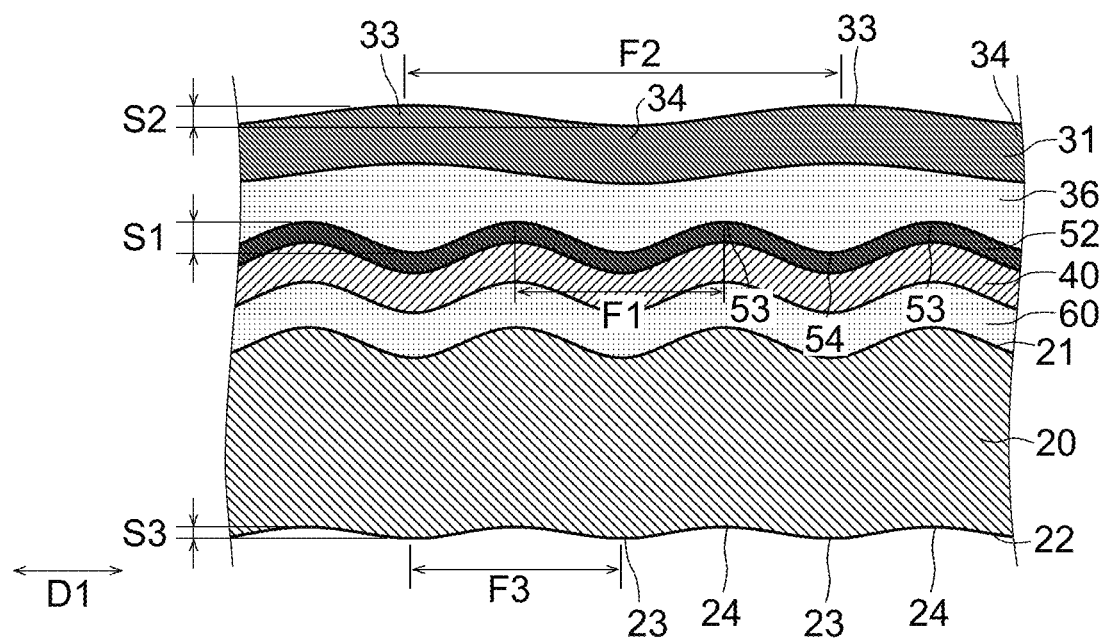
FIG. 15 is an enlarged cross-sectional view of the wiring board illustrated in FIG. 14.

FIG. 15 is an enlarged cross-sectional view of the wiring board 10 illustrated in FIG. 14. In the present modification, when tension is removed from the first substrate 20, which is joined to the support substrate 40, and the first substrate 20 contracts, peaks and valleys similar to the peaks 53 and valleys 54 of the wiring 52 appear in the support substrate 40. The characteristics and dimensions of the support substrate 40 are set to facilitate formation of such peaks and valleys. For example, the support substrate 40 has an elastic modulus greater than the first elastic modulus of the first substrate 20. In the following description, the elastic modulus of the support substrate 40 is also referred to as a third elastic modulus.

While not shown, the support substrate 40 may support the wiring 52 adjacent to the second surface 42. In this case, the stopper layer 31 is disposed adjacent to the first surface 41 of the support substrate 40.

The third elastic modulus of the support substrate 40 is, for example, greater than or equal to 100 MPa, and more preferably greater than or equal to 1 GPa. The third elastic modulus of the support substrate 40 may be greater than or equal to 100 times and less than or equal to 50000 times the first elastic modulus of the first substrate 20, and preferably greater than or equal to 1000 times and less than or equal to 10000 times the first elastic modulus of the first substrate 20. By setting the third elastic modulus of the support substrate 40 as described above, it is possible to restrain the cycle F1 of the peaks from becoming too small. It is also possible to restrain local bending in the peaks.

If the elastic modulus of the support substrate 40 is too low, the support substrate 40 easily deforms in the step of forming the wiring 52, and this makes it difficult to position the wiring 52 with respect to the support substrate 40. If the elastic modulus of the support substrate 40 is too high, the first substrate 20 cannot be easily restored to normal when relaxed, and may easily crack or bend.

The thickness of the support substrate 40 is, for example, greater than or equal to 500 nm and less than or equal to 10 μm, and more preferably greater than or equal to 1 μm and less than or equal to 5 μm. If the thickness of the support substrate 40 is too small, it is difficult to handle the support substrate 40 in the step of making the support substrate 40 or in the step of forming components, such as the wiring 52, on the support substrate 40. If the thickness of the support substrate 40 is too large, the first substrate 20 cannot be easily restored to normal when relaxed, and the first substrate 20 is unable to extend and contract as intended.

Examples of the material that can be used to form the support substrate 40 include polyethylene naphthalate, polyimide, polyethylene terephthalate, polycarbonate, and acrylic resin. It is particularly preferable to use polyethylene naphthalate or polyimide, both of which have high durability and heat resistance.

The third elastic modulus of the support substrate 40 may be less than or equal to 100 times the first elastic modulus of the first substrate 20. A method for calculating the third elastic modulus of the support substrate 40 is the same as that for the first substrate 20 or the stopper layer 31.

(Method for Manufacturing Wiring Board)

A method for manufacturing the wiring board 10 according to the present modification will now be described with reference to FIGS. 16A to 16C and FIGS. 17A to 17C.

First, the support substrate 40 is prepared. Next, the wiring 52 is formed on the first surface 41 of the support substrate 40. For example, a metal layer, such as a copper layer, is first formed on the first surface 41 of the support substrate 40 by vapor deposition. Then, the metal layer is processed by photolithography and etching. The wiring 52 is thus formed on the first surface 41.

Figure 16A:
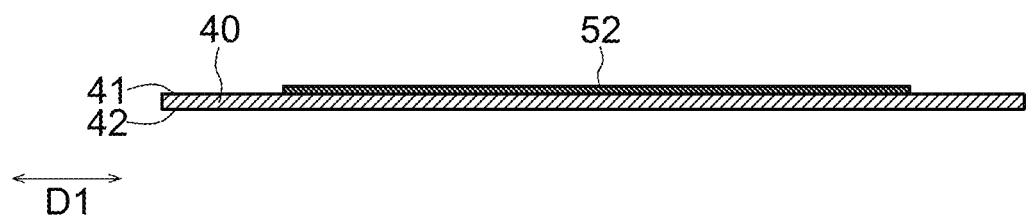
FIG. 16A is a series of diagrams for explaining a method for manufacturing the wiring board according to the fifth modification.
Figure 16B:
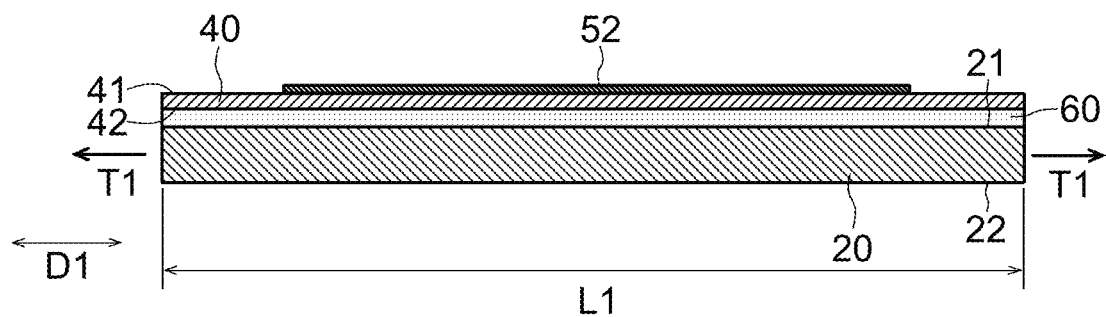
FIG. 16B is a series of diagrams for explaining a method for manufacturing the wiring board according to the fifth modification.
Figure 16C:
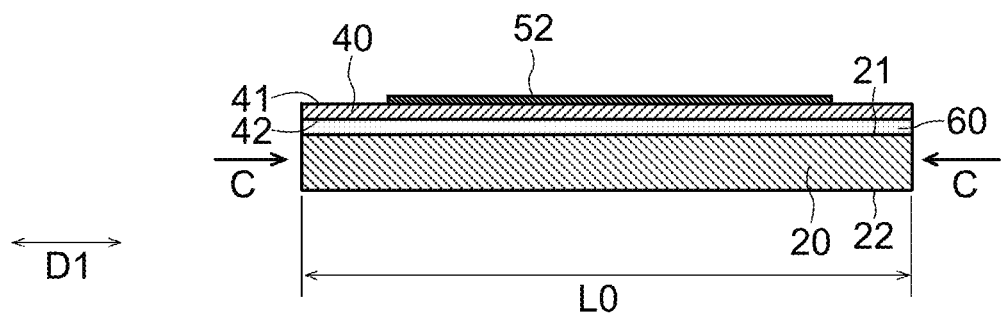
FIG. 16C is a series of diagrams for explaining a method for manufacturing the wiring board according to the fifth modification.

Next, as illustrated in FIG. 16B, a first stretching step is performed which involves applying the first tension T1 to the first substrate 20 in the first direction D1 to stretch the first substrate 20 to the dimension L1. Next, a wiring step is performed which involves adding the wiring 52 to the first surface 21 of the first substrate 20 stretched under the first tension T1 applied thereto in the first stretching step. In the wiring step of the present modification, as illustrated in FIG. 16B, the second surface 42 of the support substrate 40 having the wiring 52 thereon is joined to the first surface 21 of the first substrate 20. The first substrate 20 and the support substrate 40 may be provided with the adhesive layer 60 therebetween.

Then, a first contraction step is performed which involves removing the first tension T1 from the first substrate 20. Thus, as indicated by arrow C in FIG. 16C, the first substrate 20 contracts in the first direction D1 to cause the support substrate 40 and the wiring 52 on the first substrate 20 to deform accordingly. As described above, the deformation of the support substrate 40 and the wiring 52 may emerge in the form of an undulating portion.

Figure 17A:
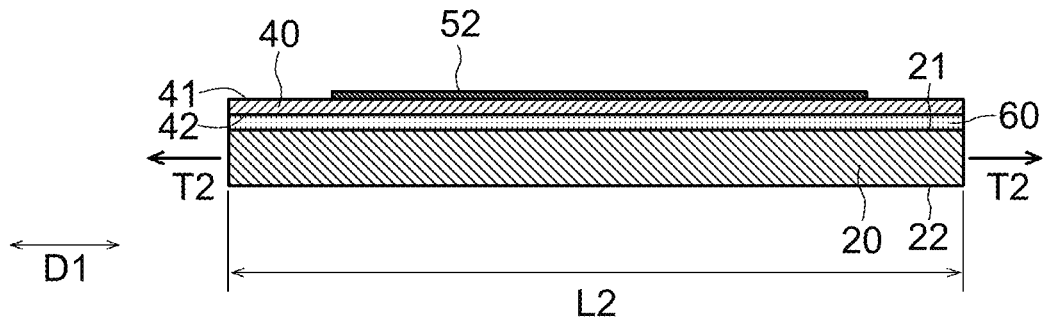
FIG. 17A is another series of diagrams for explaining the method for manufacturing the wiring board according to the fifth modification.

Next, as illustrated in FIG. 17A, a second stretching step is performed which involves applying the second tension T2 to the first substrate 20 and the support substrate 40 in the first direction D1 to stretch the first substrate 20 and the support substrate 40 to the dimension L2. As in the case of the embodiment described above, the second tension T2 is smaller than the first tension T1 applied in the first stretching step. Accordingly, the stretch ratio of the first substrate 20 in the second stretching step is smaller than the stretch ratio of the first substrate 20 in the first stretching step.

Figure 17B:
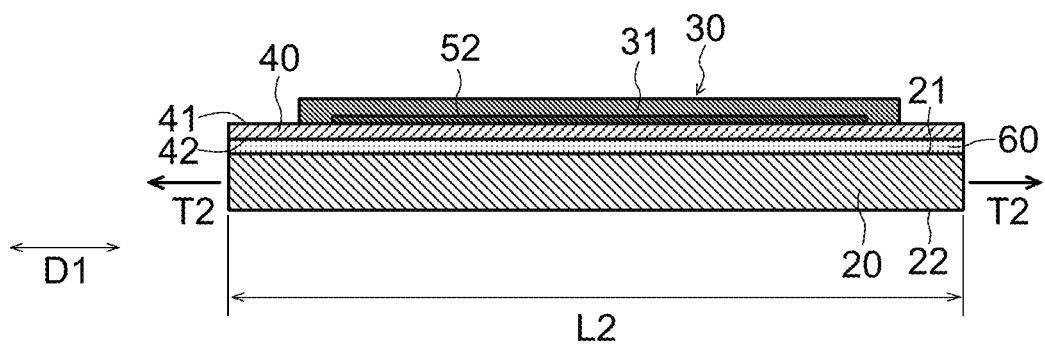
FIG. 17B is another series of diagrams for explaining the method for manufacturing the wiring board according to the fifth modification.
Figure 17C:
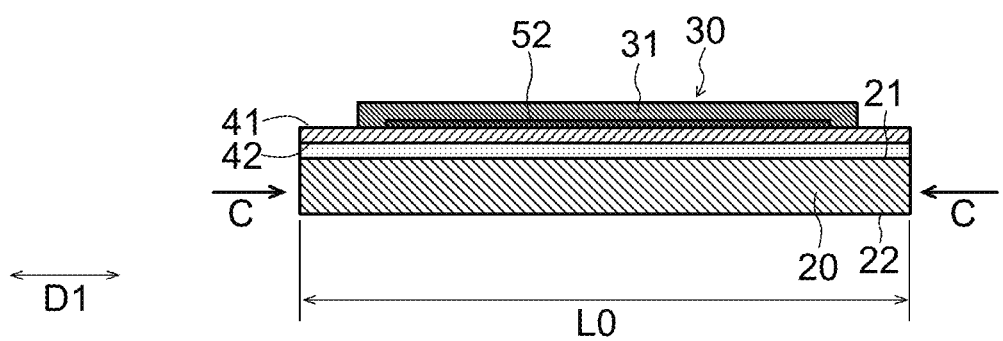
FIG. 17C is another series of diagrams for explaining the method for manufacturing the wiring board according to the fifth modification.

Next, as illustrated in FIG. 17B, a step is performed which involves adding the stopper layer 31 onto one of the first substrate 20 and the support substrate 40 stretched under the second tension T2 applied thereto in the second stretching step. For example, the stopper layer 31 formed of cloth, paper, metal foil, or resin film is bonded adjacent to the first surface 41 of the support substrate 40, with an adhesive layer interposed therebetween, in such a manner as to cover the wiring 52.

Then, a second contraction step is performed which involves removing the second tension T2 from the first substrate 20 and the support substrate 40. Thus, as indicated by arrow C in FIG. 17C, the first substrate 20 and the support substrate 40 contract in the first direction D1 to cause the stopper layer 31 on the support substrate 40 to deform accordingly. As described above, the deformation of the stopper layer 31 may emerge in the form of the undulating portion 35. The wiring board 10 is thus produced which includes the first substrate 20, the support substrate 40, the wiring 52, and the stopper 30.

In the present modification, as described above, the stretch ratio of the first substrate 20 at the time of adding the stopper layer 31 is smaller than the stretch ratio of the first substrate 20 at the time of adding the wiring 52. Accordingly, when the wiring board 10 including the first substrate 20 is stretched, the undulating portion 35 of the stopper layer 31 is eliminated before the undulating portion 55 of the wiring 52 is eliminated. Therefore, as in the case of the embodiment illustrated in FIG. 8, the second turning point P2 appears in the wiring board 10 when the stretch length E is the second stretch length E2 smaller than the first stretch length E1. The wiring board 10 can thus be suppressed from being excessively stretched. This can reduce problems in components of the wiring board 10, such as breaks in the wiring 52.

(Sixth Modification)

Figure 18:
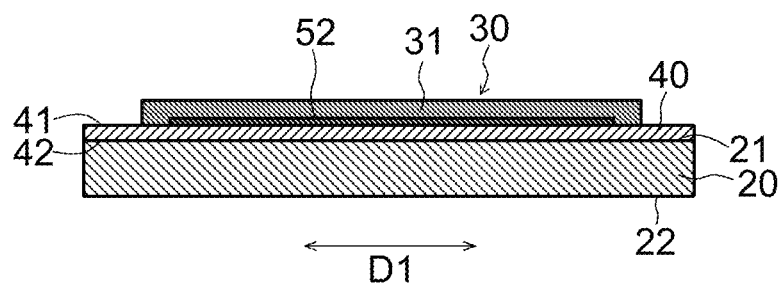
FIG. 18 is a cross-sectional view of a wiring board according to a sixth modification.

In the fifth modification described above, the support substrate 40 is joined to the first substrate 20, with the adhesive layer 60 interposed therebetween. However, the configuration is not limited to this. For example, the support substrate 40 may be joined to the first substrate 20 by molecular adhesive bonding, which involves molecularly modifying the unbonded surface. In this case, as illustrated in FIG. 18, the first substrate 20 and the support substrate 40 may be provided with no adhesive layer therebetween.

(Seventh Modification)

Figure 19:
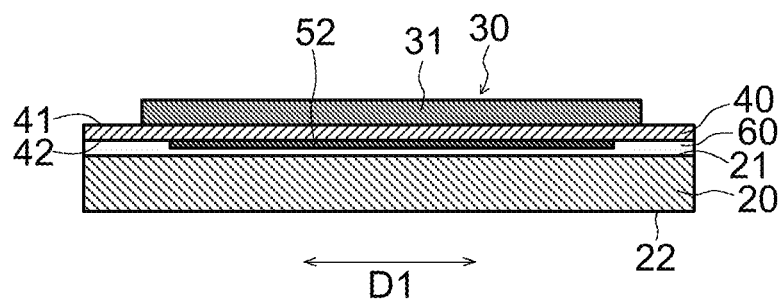
FIG. 19 is a cross-sectional view of a wiring board according to a seventh modification.

In the fifth modification and the sixth modification described above, the wiring 52 is disposed adjacent to the first surface 41 of the support substrate 40. However, the configuration is not limited to this. As illustrated in FIG. 19, the wiring 52 may be disposed adjacent to the second surface 42 of the support substrate 40. The stopper layer 31 is disposed adjacent to the first surface 41 of the support substrate 40.

(Eighth Modification)

Figure 20:
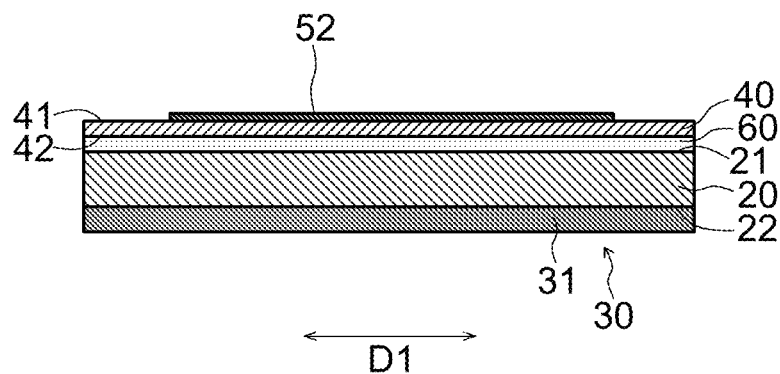
FIG. 20 is a cross-sectional view of a wiring board according to an eighth modification.

In the fifth modification, the sixth modification, and the seventh modification described above, the stopper layer 31 is disposed adjacent to the first surface 41 of the support substrate 40. However, the configuration is not limited to this. As illustrated in FIG. 20, the stopper layer 31 may be disposed adjacent to the second surface 22 of the first substrate 20. In this case, the stopper layer 31 may be in contact with the second surface 22 of the first substrate 20, or another component may be interposed between the second surface 22 of the first substrate 20 and the stopper layer 31.

(Ninth Modification)

Figure 21:
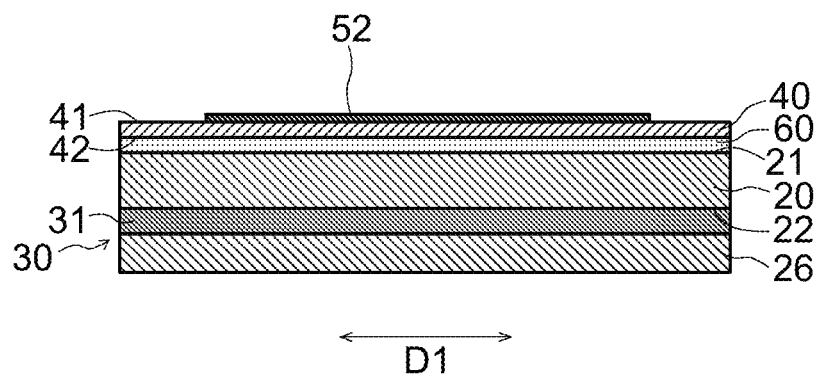
FIG. 21 is a cross-sectional view of a wiring board according to a ninth modification.

The eighth modification has presented an example in which, in the wiring board 10 including the support substrate 40, the stopper layer 31 of the stopper 30 constitutes a surface of the wiring board 10 opposite the surface thereof having the wiring 52 thereon. However, the configuration is not limited to this. As illustrated in FIG. 21, the wiring board 10 may further include the second substrate 26 disposed on the stopper layer 31. As a material forming the second substrate 26, one that has been described as a material for the first substrate 20 may be used. The material forming the first substrate 20 and the material forming the second substrate 26 may either be the same or different. An adhesive layer may be interposed between the stopper layer 31 and the second substrate 26.

(Tenth Modification)

The stopper 30 includes the stopper layer 31 in the embodiment and the modifications described above. However, the stopper 30 may have any configuration that enables the second turning point P2 to appear in the wiring board 10 when the stretch length E is the second stretch length E2 smaller than the first stretch length E1.

Figure 22:
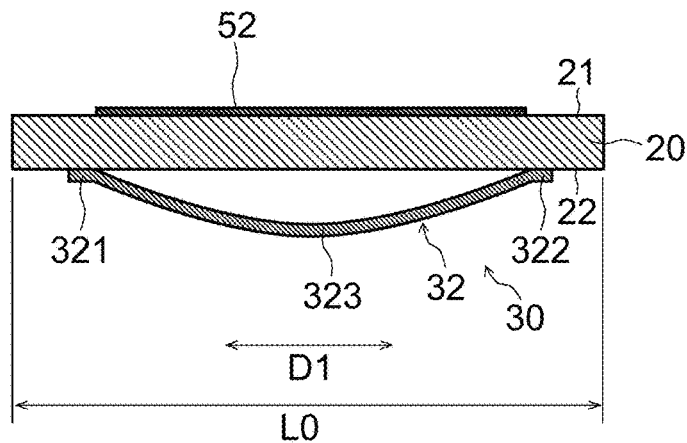
FIG. 22 is a cross-sectional view of a wiring board according to a tenth modification.

FIG. 22 is a cross-sectional view of the wiring board 10 according to the present modification. The stopper 30 includes a stopper member 32 that sags from, or is in a relaxed state with respect to, the first substrate 20 when no tension is applied to the first substrate 20. The stopper member 32 has a first end 321 and a second end 322 disposed adjacent to the second surface 22 of the first substrate 20 and coupled to the first substrate 20, and an intermediate portion 323 between the first end 321 and the second end 322. The intermediate portion 323 is longer than an imaginary straight line that connects the first end 321 and the second end 322. This means that the intermediate portion 323 is in a relaxed state with respect to the first substrate 20. Therefore, for example, when the stopper member 32 is located below the first substrate 20 as illustrated in FIG. 22, the intermediate portion 323 is separated downward, by gravity, from the second surface 22 of the first substrate 20. While not shown, the stopper member 32 may be disposed adjacent to the first surface 21 of the first substrate 20.

A method for manufacturing the wiring board 10 according to the present modification will now be described. As in the case of the embodiment illustrated in FIGS. 6A to 6C, first, the wiring 52 is formed on the first substrate 20 while the first substrate 20 is being stretched to the dimension L1 by applying the first tension T1 to the first substrate 20 in the first direction D1. Then, the first end 321 and the second end 322 of the stopper member 32 are coupled to the first substrate 20 when the first substrate 20 is shorter than the dimension L1, such as when no tension is applied to the first substrate 20.

The stopper member 32 is configured such that the sagging of the stopper member 32 is eliminated when the first substrate 20 is shorter than the dimension L1 and longer than the dimension L0 measured under no tension. For example, the length of the intermediate portion 323 of the stopper member 32 is set such that when, as illustrated in FIG. 23, the second tension T2 is applied to the first substrate 20 in the first direction D1 to stretch the first substrate 20 to the dimension L2, the sagging of the stopper member 32 is eliminated on the basis of tension applied to the stopper member 32.

Figure 23:
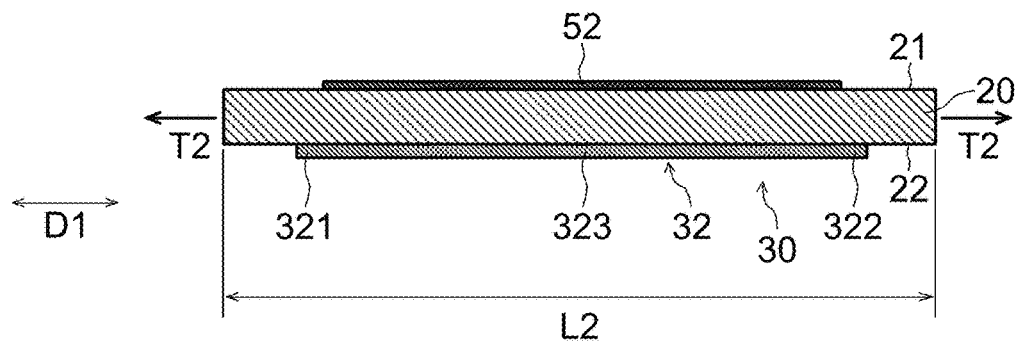
FIG. 23 is a cross-sectional view of the wiring board stretched by the second stretch length in the tenth modification.

To further stretch the wiring board 10 illustrated in FIG. 23, it is necessary to elastically deform the stopper member 32 in the first direction D1. Therefore, in the present modification, as in the case of the embodiment illustrated in FIG. 8, the second turning point P2 appears in the wiring board 10 when the stretch length E is the second stretch length E2 smaller than the first stretch length E1. The wiring board 10 can thus be suppressed from being excessively stretched. This can reduce problems in components of the wiring board 10, such as breaks in the wiring 52.

As in the case of the embodiment described above, the stopper member 32 may have an elastic modulus greater than the first elastic modulus of the first substrate 20 or may have a greater flexural rigidity than the first substrate 20, in the first direction D1. Examples of the stopper member 32 include a resin film, metal foil, metal wire, and yarn. The thickness of the stopper member 32 is, for example, greater than or equal to 1 μm and less than or equal to 5 mm, and more preferably greater than or equal to 10 μm and less than or equal to 500 μm.

(Eleventh Modification)

Figure 24:
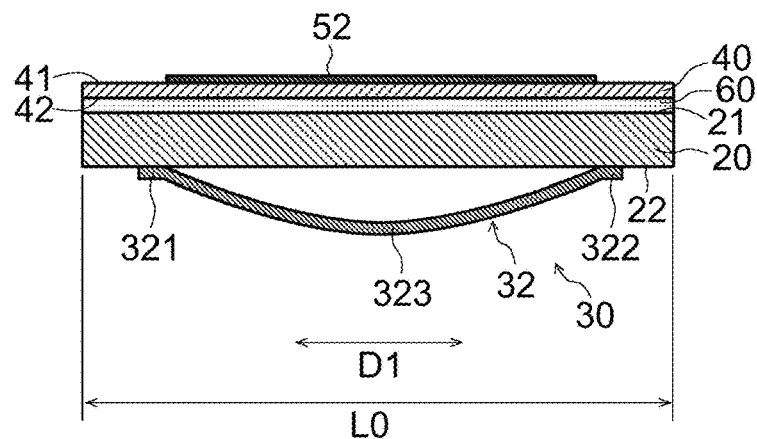
FIG. 24 is a cross-sectional view of a wiring board according to an eleventh modification.

When the stopper 30 includes the stopper member 32 as in the tenth modification described above, the wiring board 10 may include the support substrate 40 that supports the wiring 52. FIG. 24 is a cross-sectional view of the wiring board 10 according to the present modification. The wiring board 10 includes at least the first substrate 20, the support substrate 40, the wiring 52, and the stopper member 32.

As illustrated in FIG. 24, the stopper member 32 may be disposed adjacent to the second surface 22 of the first substrate 20 and coupled to the first substrate 20. While not shown, the stopper member 32 may be coupled to another component, such as the support substrate 40, and not to the first substrate 20. A multilayer body that is composed of the first substrate 20 and the support substrate 40 disposed on the first substrate 20 is also referred to as a multilayer structure. The stopper member 32 is only required to be coupled to any of the components of the multilayer structure.

A method for manufacturing the wiring board 10 according to the present modification will now be described. As in the case of the fifth modification illustrated in FIGS. 16A to 16C, the support substrate 40 having the wiring 52 thereon is joined to the first substrate 20 while the first substrate 20 is being stretched to the dimension L1 by applying the first tension T1 to the first substrate 20 in the first direction D1. Then, the first end 321 and the second end 322 of the stopper member 32 are coupled to the first substrate 20 or the support substrate 40 when the first substrate 20 is shorter than the dimension L1, such as when no tension is applied to the first substrate 20.

In the present modification, the stopper member 32 is also configured such that the sagging of the stopper member 32 is eliminated when the first substrate 20 is shorter than the dimension L1 and longer than the dimension L0 measured under no tension. Therefore, in the present modification, as in the case of the embodiment illustrated in FIG. 8, the second turning point P2 appears in the wiring board 10 when the stretch length E is the second stretch length E2 smaller than the first stretch length E1. The wiring board 10 can thus be suppressed from being excessively stretched. This can reduce problems in components of the wiring board 10, such as breaks in the wiring 52.

(Twelfth Modification)

In the eleventh modification described above, the first end 321 and the second end 322 of the stopper member 32 are coupled to the multilayer structure, regardless of whether the wiring board 10 is under tension. In the present modification, at least one of the first end 321 and the second end 322 of the stopper member 32 may be capable of being displaced with respect to the multilayer structure when the wiring board 10 is under no tension.

Figure 25:
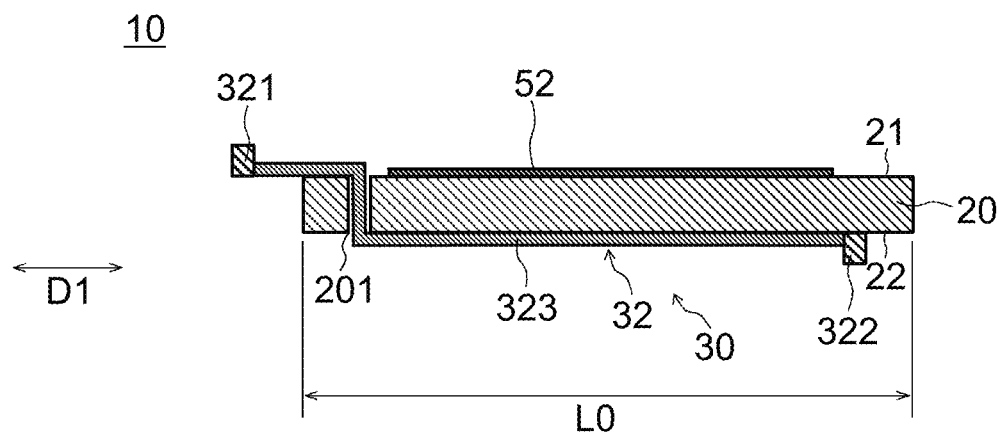
FIG. 25 is a cross-sectional view of a wiring board according to a twelfth modification.
Figure 26:
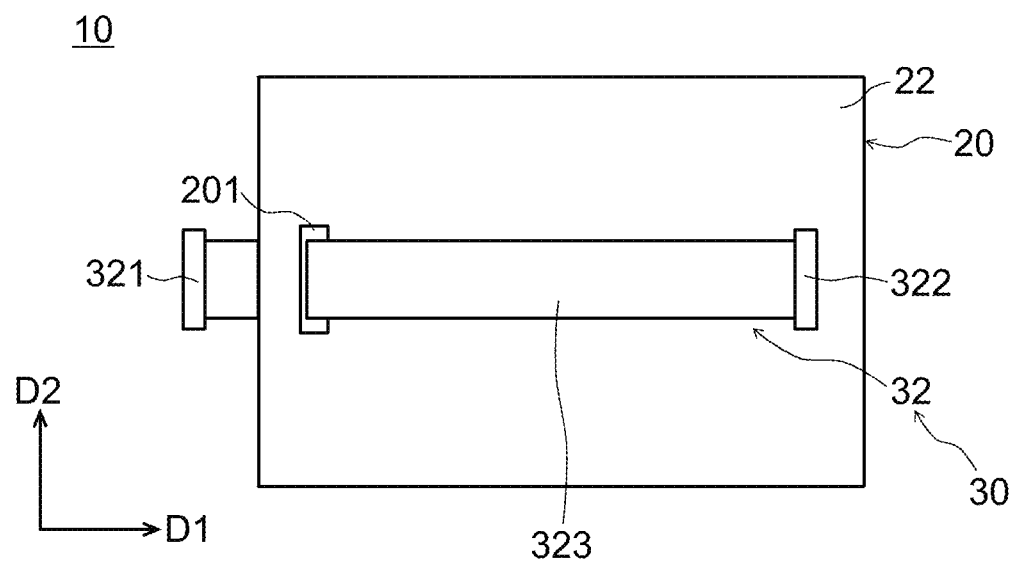
FIG. 26 is a backside view of the wiring board according to the twelfth modification.

FIG. 25 is a cross-sectional view of the wiring board 10 under no tension. FIG. 26 is a backside view of the wiring board 10 illustrated in FIG. 25, as viewed from the second surface 22 of the first substrate 20. As illustrated in FIG. 25, the first substrate 20 has a through hole 201 passing therethrough from the first surface 21 to the second surface 22. The intermediate portion 323 of the stopper member 32 extends from the first surface 21 to the second surface 22 through the through hole 201. The first end 321 of the stopper member 32 is disposed adjacent to the first surface 21 without being secured to the first substrate 20, whereas the second end 322 of the stopper member 32 is disposed adjacent to the second surface 22 and secured to the first substrate 20.

Figure 27:
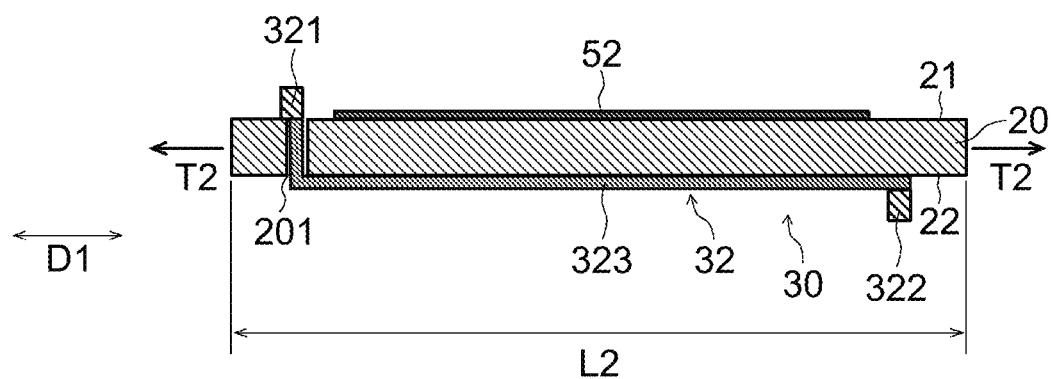
FIG. 27 is a cross-sectional view illustrating a stretched state of the wiring board illustrated in FIG. 25.

FIG. 27 is a cross-sectional view of the first substrate 20 stretched to the dimension L2 by applying the second tension T2 to the first substrate 20 in the first direction D1. The first end 321 is configured not to pass through the through hole 201 in the first substrate 20. For example, the first end 321 has a greater dimension than the through hole 201 in the planar direction of the first surface 21 of the first substrate 20. Therefore, as illustrated in FIG. 27, when the first substrate 20 is stretched to cause the first end 321 to move to the through hole 201, the first end 321 gets caught in the through hole 201 and becomes unable to move further. To further stretch the first substrate 20 illustrated in FIG. 27, it is necessary to elastically deform the intermediate portion 323 of the stopper member 32. Therefore, in the present modification, as in the case of the embodiment illustrated in FIG. 8, the second turning point P2 appears in the wiring board 10 when the stretch length E is the second stretch length E2 smaller than the first stretch length E1. The wiring board 10 can thus be suppressed from being excessively stretched. This can reduce problems in components of the wiring board 10, such as breaks in the wiring 52.

(Thirteenth Modification)

Figure 28:
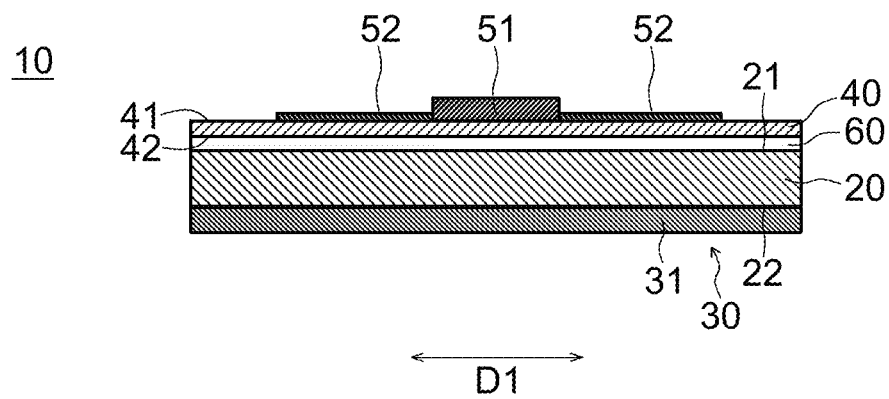
FIG. 28 is a cross-sectional view of a wiring board according to a thirteenth modification.

FIG. 28 is a cross-sectional view of the wiring board 10 according to the present modification. As illustrated in FIG. 28, the wiring board 10 may include an electronic component 51 electrically connected to the wiring 52. In the example illustrated in FIG. 28, the electronic component 51 is disposed adjacent to the first surface 41 of the support substrate 40. Alternatively, the wiring board 10 may be configured to accommodate the electronic component 51 to be electrically connected to the wiring 52.

The electronic component 51 may have an electrode connected to the wiring 52. In this case, the wiring board 10 has a connecting portion electrically connected to the wiring 52 while being in contact with the electrode of the electronic component 51. The connecting portion is, for example, a pad.

The electronic component 51 does not necessarily need to have an electrode connected to the wiring 52. For example, the electronic component 51 may include an element integral with at least one of a plurality of components of the wiring board 10. Examples of this electronic component 51 include one that includes a conductive layer integral with a conductive layer forming the wiring 52 of the wiring board 10, and one that includes a conductive layer located at a different level from a conductive layer forming the wiring 52. For example, the electronic component 51 may be a pad formed by a conductive layer having a greater width, in plan view, than a conductive layer forming the wiring 52. For example, a test probe or a terminal for updating software is connected to the pad. The electronic component 51 may be a wiring pattern formed by a conductive layer that extends spirally in plan view. As described above, the electronic component 51 may be a portion formed by patterning of a conductive layer and provided with a predetermined function.

The electronic component 51 may be an active element, a passive element, or a mechanical element. Examples of the electronic component 51 include transistors, large-scale integration (LSI), micro-electromechanical systems (MEMS), relays, light-emitting devices such as LEDs, OLEDs, and LCDs, sensors, sound-generating components such as buzzers, vibrating components that generate vibration, cooling and heat-generating components such as Peltier devices that control cooling and heating and heating wires, resistors, capacitors, inductors, piezoelectric elements, switches, and connectors. Among the examples of the electronic component 51 described above, sensors are particularly suitably used. Examples of the sensors include temperature sensors, pressure sensors, light sensors, photoelectric sensors, proximity sensors, shear force sensors, biometric sensors, laser sensors, microwave sensors, humidity sensors, distortion sensors, gyro sensors, acceleration sensors, displacement sensors, magnetic sensors, gas sensors, GPS sensors, ultrasonic sensors, odor sensors, brain wave sensors, current sensors, vibration sensors, pulse wave sensors, electrocardiogram sensors, and luminosity sensors. Among the sensors, biometric sensors are particularly preferable. The biometric sensors are capable of measuring biological information, such as heart rate, pulse, electrocardiogram, blood pressure, body temperature, and blood oxygen level.

Applications of the electronic component 51 having no electrode will now be described. For example, the pad, described above, may function as a portion to which a test probe or a terminal for updating software is connected. A wiring pattern formed by spiral extension may function as an antenna.

Some modifications of the embodiment have been described. It is obvious that more than one of the modifications can be used in appropriate combination.

EXAMPLES

A more concrete description of the present invention will now be given using examples and a comparative example. Note that the present invention is not limited to the description of the examples, unless it departs from its scope.

Comparative Example 1

Figure 29:
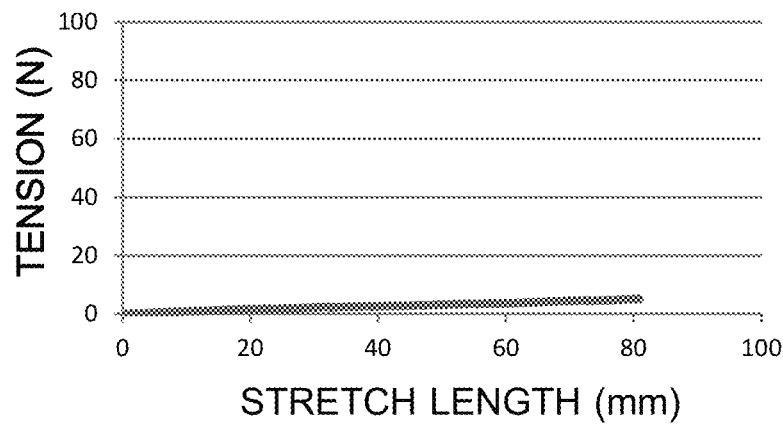
FIG. 29 is a diagram illustrating how tension changes when a first substrate is stretched in Comparative Example 1.

A coating of polydimethylsiloxane (PDMS) formed by two-liquid addition condensation was applied onto a support base to a thickness of 1.5 mm and the PDMS was cured. The first substrate 20 was thus formed on the support base. Next, a part of the first substrate 20 was extracted as a sample, on which a tensile test was performed in conformity with JIS K6251. A 100-mm-long portion of the sample was placed under tension. The result of the tensile test is shown in FIG. 29. As in FIG. 29, when the stretch length was in the 0 mm to 80 mm range, an increase in tension per unit stretch length was constant.

Example 1

Figure 30:
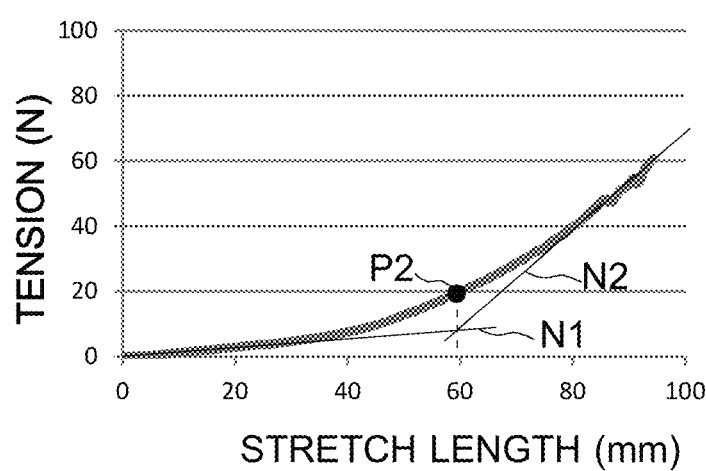
FIG. 30 is a diagram illustrating an example of how tension changes when a first substrate is stretched in Example 1.

With the stopper member 32 attached to the sample of the first substrate 20 in Comparative Example 1, a tensile test was performed in the same manner as in Comparative Example 1. Cloth in a relaxed state with respect to the first substrate 20 was used as the stopper member 32. The cloth used here was 1-mm-thick MU7301 from UNITIKA LTD. The result of the tensile test is shown in FIG. 30. As in FIG. 30, when the stretch length was about 60 mm, a second turning point appeared, at which an increase in tension per unit stretch length changed.

Example 2

Figure 31:
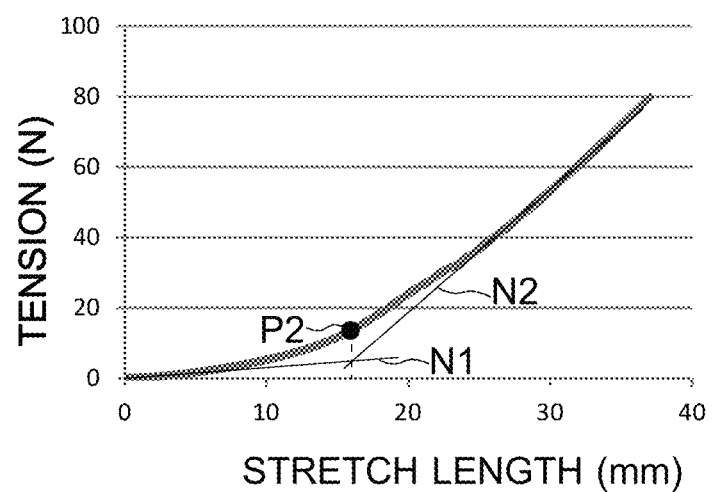
FIG. 31 is a diagram illustrating an example of how tension changes when a first substrate is stretched in Example 2.

A tensile test was performed in the same manner as in Example 1, except that 1-mm-thick Z14720 from UNITIKA LTD. was used as cloth forming the stopper member 32. The result of the tensile test is shown in FIG. 31. As in FIG. 31, when the stretch length was about 17 mm, a second turning point appeared, at which an increase in tension per unit stretch length changed.

Example 3A

Figure 32:
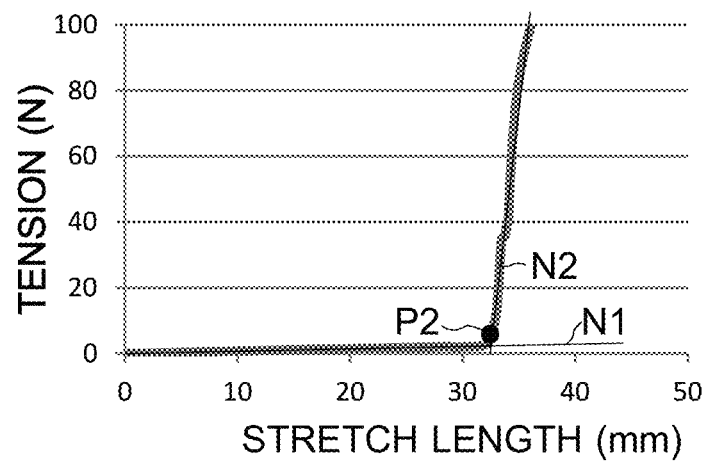
FIG. 32 is a diagram illustrating an example of how tension changes when a first substrate is stretched in Example 3A.

A tensile test was performed in the same manner as in Example 1, except that 0.08-mm-thick paper was used as the stopper member 32. The result of the tensile test is shown in FIG. 32. As in FIG. 32, when the stretch length was about 32 mm, a second turning point appeared, at which an increase in tension per unit stretch length changed.

Example 3B

Figure 33:
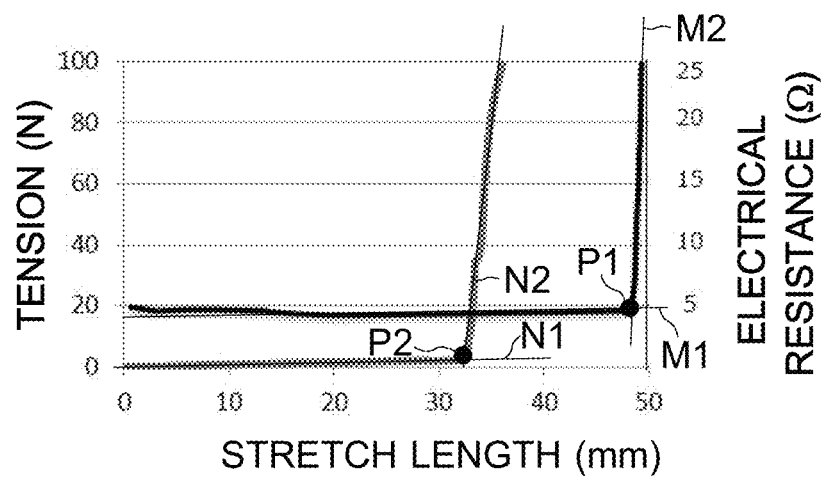
FIG. 33 is a diagram illustrating an example of how the tension and the electrical resistance of wiring change when a wiring board is stretched in Example 3B.

First, with the sample of the first substrate 20 being stretched by a stretch ratio of 50%, the wiring 52 was formed on the first substrate 20. Then, tension was removed from the first substrate 20 to allow the first substrate 20 to contract. Next, as in the case of Example 3A, 0.08-mm-thick paper was attached, as the stopper member 32, to the first substrate 20. Then, in the same manner as in Example 3A, a tensile test was performed to measure tension and electrical resistance of the wiring 52. The result is shown in FIG. 33. As in FIG. 33, when the stretch length was about 32 mm, a second turning point appeared, at which an increase in tension per unit stretch length changed. Also, when the stretch length was about 48 mm, a first turning point appeared, at which an increase in electrical resistance per unit stretch length changed.

Example 4

Figure 34:
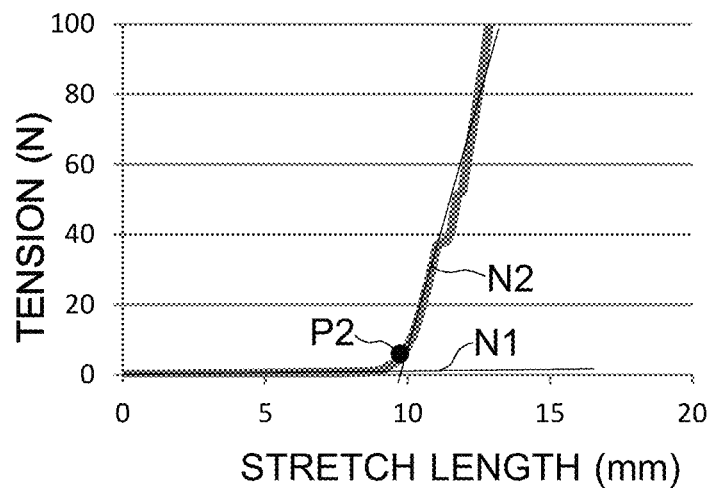
FIG. 34 is a diagram illustrating an example of how tension changes when a first substrate is stretched in Example 4.

A tensile test was performed in the same manner as in Example 1, except that a 0.5-mm-thick metal foil of stainless steel was used as the stopper member 32. The result of the tensile test is shown in FIG. 34. As in FIG. 34, when the stretch length was about 10 mm, a second turning point appeared, at which an increase in tension per unit stretch length changed.

Example 5

Figure 35:
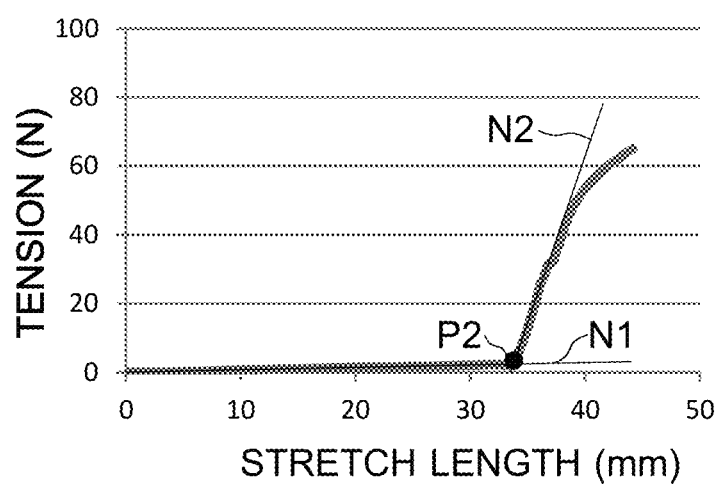
FIG. 35 is a diagram illustrating an example of how tension changes when a first substrate is stretched in Example 5.

A tensile test was performed in the same manner as in Example 1, except that a 0.1-mm-thick resin film of polyethylene naphthalate was used as the stopper member 32. The result of the tensile test is shown in FIG. 35. As in FIG. 35, when the stretch length was about 34 mm, a second turning point appeared, at which an increase in tension per unit stretch length changed.

REFERENCE SIGNS LIST

10: wiring board
20: first substrate
21: first surface
22: second surface
23: peak
24: valley
26: second substrate
30: stopper
31: stopper layer
32: stopper member
321: first end
322: second end
323: intermediate portion
33: peak
34: valley
36: adhesive layer
40: support substrate
41: first surface
42: second surface
51: electronic component
52: wiring
53: peak
54: valley

The invention claimed is:

1. A wiring board comprising:
a first substrate with stretchability, the first substrate having a first surface and a second surface opposite the first surface;
wiring disposed adjacent to the first surface of the first substrate, the wiring extending in a first direction; and
a stopper disposed adjacent to the first surface or second surface of the first substrate,
wherein while stretch length of the wiring board is being increased in the first direction, electrical resistance of the wiring exhibits a first turning point at a first stretch length and tension applied to the wiring board exhibits a second turning point at a second stretch length smaller than the first stretch length, the first stretch length being a stretch length of the wiring board in the first direction, the second stretch length being a stretch length of the wiring board in the first direction, the first turning point being a point at which an increase in electrical resistance per unit stretch length changes, the second turning point being a point at which an increase in tension per unit stretch length changes.

2. The wiring board according to claim 1, wherein the wiring has a plurality of peaks appearing along the first direction.

3. The wiring board according to claim 1, wherein the stopper has a higher flexural rigidity or elastic modulus than the first substrate.

4. The wiring board according to claim 1, wherein the first stretch length is greater than or equal to 1.1 times the second stretch length.

5. The wiring board according to claim 1, wherein a second tension increase rate is greater than a first tension increase rate, the first tension increase rate referring to the increase in tension per unit stretch length measured when the stretch length of the wiring board in the first direction is smaller than the second stretch length, the second tension increase rate referring to the increase in tension per unit stretch length measured when the stretch length of the wiring board in the first direction is greater than the second stretch length.

6. The wiring board according to claim 5, wherein the second tension increase rate is greater than or equal to twice the first tension increase rate.

7. The wiring board according to claim 1, wherein a second electrical resistance increase rate is greater than a first electrical resistance increase rate, the first electrical resistance increase rate referring to the increase in electrical resistance per unit stretch length measured when the stretch length of the wiring board in the first direction is smaller than the first stretch length, the second electrical resistance increase rate referring to the increase in electrical resistance per unit stretch length measured when the stretch length of the wiring board in the first direction is greater than the first stretch length.

8. The wiring board according to claim 7, wherein the second electrical resistance increase rate is greater than or equal to twice the first electrical resistance increase rate.

9. The wiring board according to claim 1, wherein the stopper includes a stopper layer having a plurality of peaks appearing along the first direction.

10. The wiring board according to claim 9, wherein the stopper layer is disposed adjacent to the first surface of the first substrate.

11. The wiring board according to claim 9, wherein the stopper layer is disposed adjacent to the second surface of the first substrate.

12. The wiring board according to claim 11, further comprising a second substrate disposed adjacent to the second surface of the first substrate, the second substrate being configured to cover the stopper layer.

13. The wiring board according to claim 1, wherein the stopper includes a stopper member having a first end, a second end, and an intermediate portion between the first end and the second end, the first end and the second end being coupled to a multilayer structure including the first substrate, the intermediate portion being capable of being spaced apart from the multilayer structure.

14. The wiring board according to claim 1, wherein the first substrate contains a thermoplastic elastomer, a silicone rubber, a urethane gel, or a silicone gel.

15. The wiring board according to claim 1, wherein the stopper includes a fiber, a paper, a metal foil, or a resin film.

16. The wiring board according to claim 1, further comprising a support substrate.

17. The wiring board according to claim 16, wherein the support substrate has a higher elastic modulus than the first substrate and supports the wiring.

18. The wiring board according to claim 16, wherein the support substrate is disposed between the wiring and the first surface of the first substrate and supports the wiring.

19. The wiring board according to claim 16, wherein the support substrate contains polyethylene naphthalate, polyimide, polycarbonate, acrylic resin, or polyethylene terephthalate.

20. The wiring board according to claim 1, further comprising an electronic component electrically connected to the wiring.

21. A wiring board comprising:
a first substrate with stretchability, the first substrate having a first surface and a second surface opposite the first surface;
wiring disposed adjacent to the first surface of the first substrate, the wiring extending in a first direction; and
a stopper disposed adjacent to the first surface or second surface of the first substrate,
wherein the wiring has a plurality of peaks appearing along the first direction; and
the stopper includes at least
a stopper layer having a plurality of peaks appearing along the first direction with a cycle greater than a cycle with which the plurality of peaks of the wiring appear along the first direction, or
a stopper member having a first end, a second end, and an intermediate portion between the first end and the second end, the first end and the second end being coupled to a multilayer structure including the first substrate, the intermediate portion being capable of being spaced apart from the multilayer structure.

22. A wiring board manufacturing method for manufacturing a wiring board, the method comprising:
a first stretching step of applying tension to a first substrate to stretch the first substrate, the first substrate having stretchability;
a wiring step of forming wiring adjacent to a first surface of the first substrate stretched in the first stretching step, the wiring extending in a first direction; and
a contraction step of removing the tension from the first substrate,
wherein the wiring board includes a stopper disposed adjacent to the first surface or second surface of the first substrate, the second surface being opposite the first surface; and
while stretch length of the wiring board is being increased in the first direction, electrical resistance of the wiring exhibits a first turning point at a first stretch length and tension applied to the wiring board exhibits a second turning point at a second stretch length smaller than the first stretch length, the first stretch length being a stretch length of the wiring board in the first direction, the second stretch length being a stretch length of the wiring board in the first direction, the first turning point being a point at which an increase in electrical resistance per unit stretch length changes, the second turning point being a point at which an increase in tension per unit stretch length changes.

23. The wiring board manufacturing method according to claim 22, further comprising:
a second stretching step of stretching the first substrate by a stretch ratio smaller than in the first stretching step after forming the wiring to the first substrate; and
a step of providing the stopper adjacent to the first surface or second surface of the first substrate stretched in the second stretching step.

24. The wiring board manufacturing method according to claim 22, wherein the stopper includes a stopper member having a first end, a second end, and an intermediate portion between the first end and the second end, the first end and the second end being coupled to a multilayer structure including the first substrate, the intermediate portion being capable of being spaced apart from the multilayer structure.

* * * * *